(12) United States Patent
Orino

(10) Patent No.: US 7,170,686 B2
(45) Date of Patent: Jan. 30, 2007

(54) ILLUMINATION OPTICAL SYSTEM, EXPOSURE APPARATUS, AND DEVICE MANUFACTURING METHOD USING THE SAME

(75) Inventor: Kanjo Orino, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 100 days.

(21) Appl. No.: 11/105,866

(22) Filed: Apr. 13, 2005

(65) Prior Publication Data

US 2005/0230599 A1    Oct. 20, 2005

(30) Foreign Application Priority Data

Apr. 14, 2004 (JP) ............... 2004-119249

(51) Int. Cl.
| | | |
|---|---|---|
| G02B 9/00 | (2006.01) | |
| G02B 15/14 | (2006.01) | |
| G03B 27/54 | (2006.01) | |
| G03B 27/52 | (2006.01) | |
| G02B 13/30 | (2006.01) | |

(52) U.S. Cl. .............. 359/649; 355/367; 355/355; 359/434; 359/690

(58) Field of Classification Search .............. 355/55, 355/67; 359/424, 432, 434, 649, 690
See application file for complete search history.

(56) References Cited

U.S. PATENT DOCUMENTS

| 5,982,558 | A | 11/1999 | Fürter et al. |
| 6,560,012 | B2 * | 5/2003 | Adachi et al. ............ 359/368 |
| 6,765,649 | B2 | 7/2004 | Orino |
| 6,856,377 | B2 | 2/2005 | Suenaga |
| 6,995,918 | B2 * | 2/2006 | Terasawa et al. .......... 359/649 |
| 2003/0197847 | A1 | 10/2003 | Shinoda |

FOREIGN PATENT DOCUMENTS

| JP | 2002-55277 | 2/2002 |
| JP | 2002-353100 | 12/2002 |
| JP | 09-197270 | 10/2003 |
| JP | 2003-318086 | 11/2003 |

OTHER PUBLICATIONS

English Abstract of 2003-318086 (Item A).
English Abstract of 2002-353100 (Item B).
English Abstract of 2002-55277 (Item C).
English Abstract of 09-197270 (Item D).

* cited by examiner

*Primary Examiner*—David N. Spector
(74) *Attorney, Agent, or Firm*—Morgan & Finnegan LLP

(57) ABSTRACT

Disclosed is an illumination optical system having an imaging optical system for imaging a predetermined object plane upon an image plane, by use of light supplied from an integrator that functions to produce a plurality of light sources using light from a light source. In one preferred form of the invention, the imaging optical system includes, in an order from a light incidence side thereof, a first lens group having a positive power, a second lens group having a negative power, and a third lens group having a positive power, wherein the second lens group includes a concave lens at a light exit side thereof and wherein the third lens group includes a convex lens at a light entrance side thereof. The position of intersection between an optical axis of the imaging optical system and a principal ray of abaxial light is defined between the second lens group and the third lens group.

15 Claims, 19 Drawing Sheets

ILLUMINATION OPTICAL SYSTEM, EXPOSURE APPARATUS, AND DEVICE MANUFACTURING METHOD USING THE SAME

FIELD OF THE INVENTION AND RELATED ART

This invention relates generally to an illumination optical system and an exposure apparatus having the same. More particularly, the invention concerns an illumination optical system and an exposure apparatus having the same suitably usable in a lithographic process for manufacture of semiconductor devices or liquid crystal display devices, for example.

Production of semiconductor devices based on an extraordinarily fine pattern such as LSI or VLSI involves an exposure process for transferring a circuit pattern formed on a reticle onto a substrate having a surface with a photosensitive material applied thereto, in a reduced scale, and this process uses a reduction projection exposure apparatus. With increasing packaging density of semiconductor device, further miniaturization of a circuit pattern has been required. Also, because of advancement of resist process as well, exposure apparatuses must meet further improvement of the resolving power.

A general example made in an attempt to meet this is optimizing the ratio, called "σ value", between the numerical aperture (NA) of a projection optical system of the projection exposure apparatus and the numerical aperture (NA) of an illumination optical system thereof. Recently, however, yet further enlargement of the NA is even required in those projection exposure apparatuses having an already heightened NA.

In such further enlargement of NA, the performance has to be improved while satisfying various limitational conditions related to the structure and the optical materials. The optical design of the projection optical system is therefore strictly difficult, and on the other hand the optical design of the illumination optical system as well is very troublesome. Particularly, among theses, the optical design of a relay optical system and an imaging optical system (mask imaging optical system) being disposed after a fly's-eye lens and for directing light from secondary light sources defined by the fly's-eye lens toward a reticle, is difficult.

Another example attempting further NA enlargement is an illumination optical system having an imaging optical system (σ continuous changeable optical system) with a magnification changing function, which is disposed after a glass rod to enable continuous adjustment of σ value thereby to assure best balance of a resolving power and a contrast with respect to a particular pattern. However, further extension of the magnification changing range of such σ continuous changing optical system is required, and thus the difficulty of its optical design is magnified more.

SUMMARY OF THE INVENTION

In an optical system for apparatuses that use high energy laser light as a light source, such as a projection exposure apparatus used in a lithographic process, the light energy density is heightened at a light re-collected (imaged) position of the light source. If such light re-collected position is defined inside a lens, it may cause deterioration of the internal transmittance of the lens material or deterioration of an anti-reflection film applied on the lens surface. This may result in local decrease of illuminance of the illumination optical system causing illuminance non-uniformness, or in overall illuminance degradation causing decreased throughput of exposure apparatus. Alternatively, it may result in distortion of effective light source, causing non-uniformness of printed linewidth.

It is accordingly an object of the present invention to provide an illumination optical system by which at least one of the inconveniences described above can be solved or reduced.

It is another object of the present invention to provide an illumination optical system by which a light re-collected position where the light energy density can be high, can be defined outside a lens.

In accordance with an aspect of the present invention, there is provided an illumination optical system, comprising: an integrator for forming a plurality of light source images by use of light from a light source; and an imaging optical system for imaging a predetermined object plane, upon an image plane, by use of light from said integrator, said imaging optical system including, in an order from a light entrance side thereof, a first lens group having a positive power, a second lens group having a negative power, and a third lens group having a positive power, wherein said second lens group includes a concave lens at a light exit side thereof and wherein said third lens group includes a convex lens at a light entrance side thereof; wherein a position of intersection between an optical axis of said imaging optical system and a principal ray of abaxial light is defined between said second lens group and said third lens group.

In accordance with another aspect of the present invention, there is provided an exposure apparatus, comprising: an illumination optical system as recited above, for illuminating a reticle; and a projection optical system for projecting an image of a pattern of a reticle onto a substrate.

In accordance with a further aspect of the present invention, there is provided a device manufacturing method, comprising the step of: exposing a substrate by use of an exposure apparatus as recited above; and developing the exposed substrate.

In accordance with a yet further aspect of the present invention, there is provided an imaging optical system for imaging a predetermined object plane upon an image plane, said imaging optical system comprising: a first lens group having a positive power, a second lens group having a negative power, and a third lens group having a positive power, which are disposed in the named order from a light entrance side of said imaging optical system; wherein said second lens group includes a concave lens at a light exit side thereof, and said third lens group includes a convex lens at a light entrance side thereof; and wherein a position of intersection between an optical axis of said imaging optical system and a principal ray of abaxial light is defined between said second lens group and said third lens group.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

[Embodiment 1]

Figure 1:
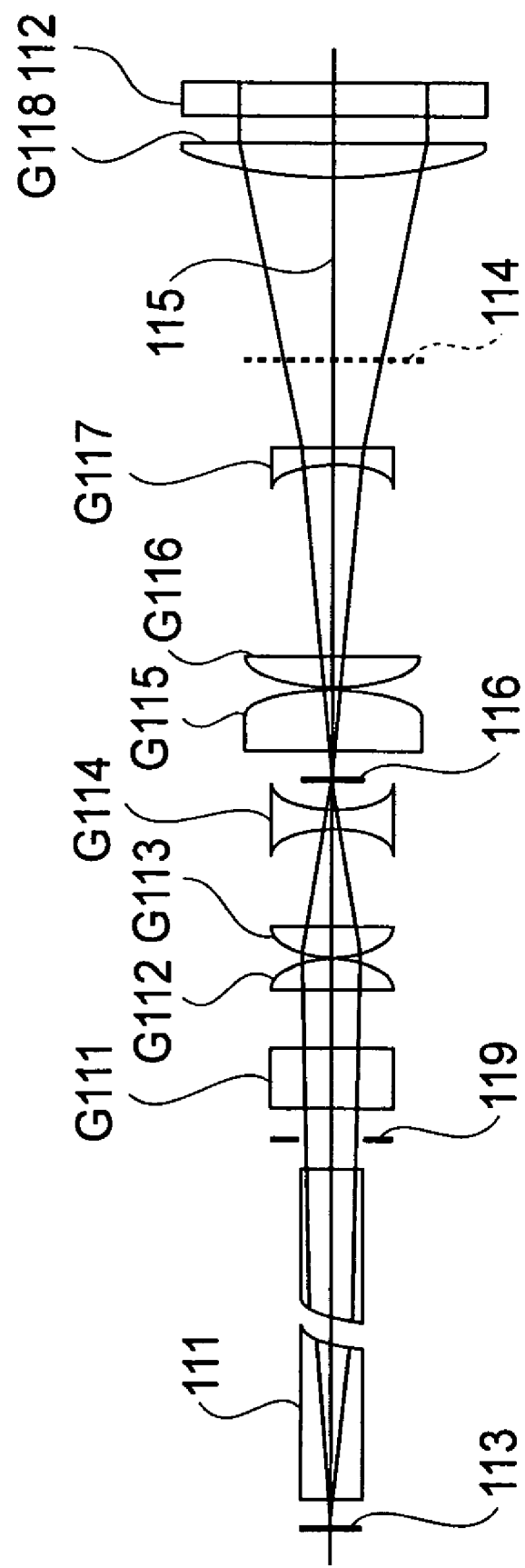
FIG. 1 is a schematic view of an illumination optical system according to a first embodiment of the present invention.

Referring to FIGS. 1–4, a first embodiment of the present invention will be described. In this embodiment, as shown in FIG. 1, a re-imaging optical system having a function for continuously changing the extension of illuminating range upon an image plane is provided between a pole-like glass (glass rod) 111 and a fly's-eye lens 112. The light exit port of the rod-like glass 111 and the light entrance port of the fly's eye lens 112 are placed in an imaging relationship. The position where light from a light source, defined at a secondary light source position 113 which is at the light entrance side of the rod-like glass 111, is re-collected is the place where the light energy becomes largest. The first embodiment is an example of re-imaging optical system which is arranged so that the light re-collecting position is defined out of any lens elements.

FIG. 1 illustrates the re-imaging optical system of this embodiment as being placed in the state in which the range of illumination upon the image plane becomes largest, that is, the state of largest σ. The re-imaging optical system comprises a first lens group consisting of a plane parallel plate G111 and two convex lenses G112 and G113, a second lens group consisting of a single concave lens G114 only, a third lens group consisting of convex lenses G115 and G116, and a fourth lens group consisting of a single convex lens 118 disposed after a concave lens G117. There is a light path bending portion 114 provided between the concave lens G117 and the convex lens G118. The power of the first lens group and the spacing between principal points of the first and second lens groups are determined so that the point of intersection between the optical axis 115 and the principal ray of abaxial light is defined between the concave lens G114 and the convex lens G115. For, with this arrangement, the position (light re-collecting position 116) where light from the secondary light source position 113 is re-collected and the light energy density becomes largest can be present between the concave lens G114 and the convex lens G115 in the largest σ state.

Figure 2:
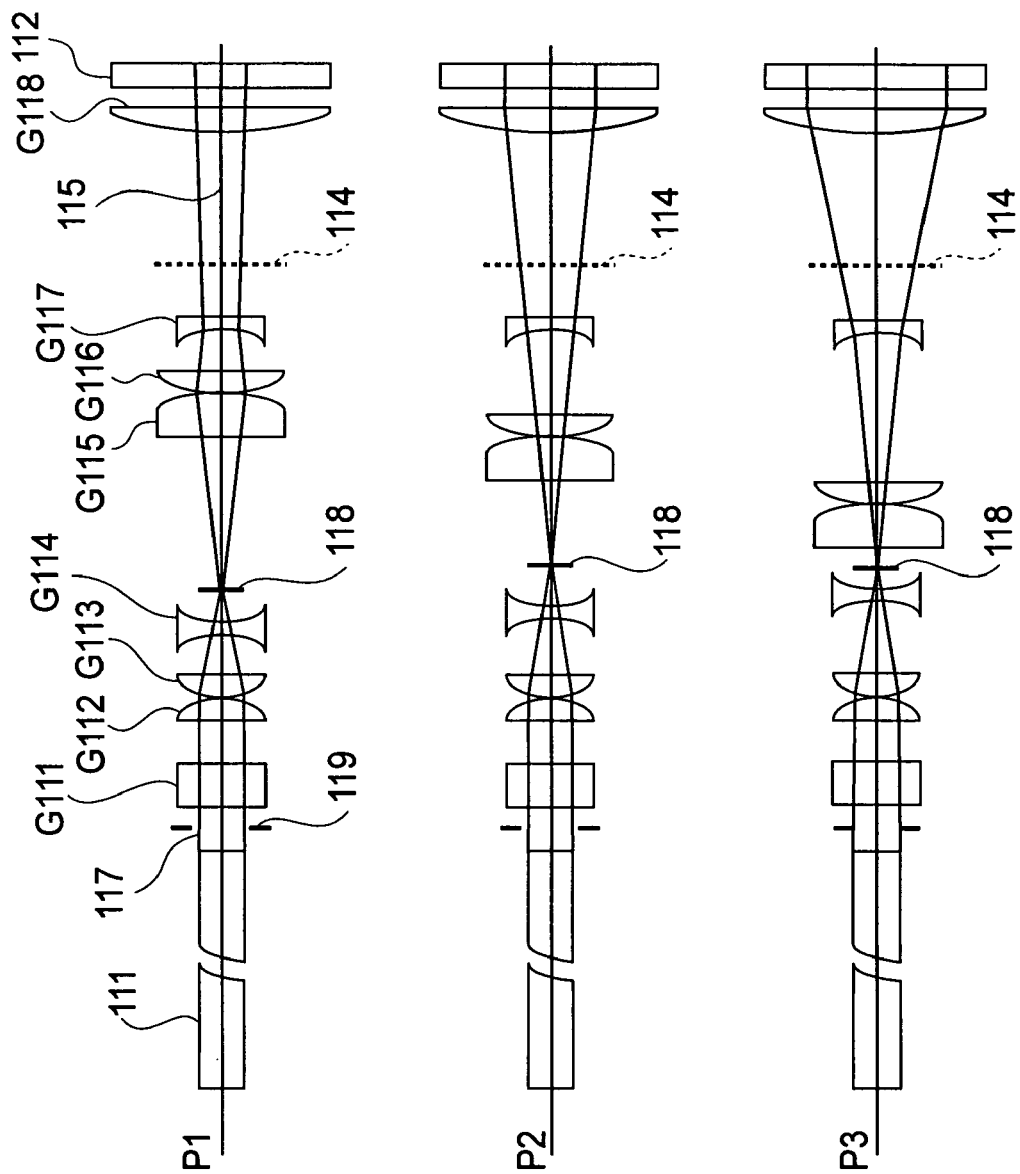
FIG. 2 is a schematic view for explaining magnification change in a re-imaging optical system used in the first embodiment of the present invention.

In the structure described above, variable-magnification positions are provided as shown in FIG. 2 while taking the second lens group comprising concave lens G114 as a first movable group and taking the third lens group comprising convex lenses G115 and G116 as a second movable group. Where the illumination range on the image plane should be made small, that is, if σ value is going to be made small, the first movable group is displaced toward the light entrance side, while on the other hand the second movable group is displaced toward the light exit side of the re-imaging optical system. Hence, a variable illumination range optical system can be accomplished by which the range of illumination on the image plane can be changed continuously with both the intersection point position 118 between the optical axis 115 and the principal ray 117 of abaxial light and the light re-collecting position 116 as well kept placed in a space between the concave lens G114 and the convex lens G115, while on the other hand the back focus position can be maintained at a level practically without any inconveniences. In FIG. 2, the smallest σ position is illustrated as P1, an intermediate σ position is illustrated as P2, and the largest σ position is illustrated as P3, respectively.

Thus, in the re-imaging optical system of this embodiment, throughout the whole magnification changing range thereof it is assured that the light re-collecting position 116 is defined out of any lens elements. In other words, throughout the whole variable magnification range, the illumination zone where the energy density becomes largest can be kept out of any lens elements but can be held present in a space.

In this embodiment, an afocal optical system that comprises concave lens G117 and convex lens G118, disposed in an order from the light entrance side, is provided after the second movable group. With this arrangement, the parallelism, with respect to the optical axis, of a principal ray of abaxial light directed to the fly's eye lens 112, namely, the telecentricity, can be maintained at a level without any practical inconveniences.

In order to maintain the uniformness of light to be projected onto the fly's eye lens 112, or for suppression of distortion aberration, particularly, for suppression of the amount of change of distortion aberration due to magnification change toward the large-σ side, it is desirable that, in the lens group at the light entrance side which constitutes the second movable group and which has a negative power, the curvature of the surface at the light entrance side is made larger than the curvature of the surface at the light exit side and also that there is a concave lens G117 present which lens has a concave surface facing toward the light entrance side.

Table 1 below shows numerical values of the specification of the re-imaging optical system used in the first embodiment.

TABLE 1

λ = 0.248 μm, Aperture Stop Opening (Diameter) = 10 mm, Entrance = 0.1

|    | r          | d           | n       | k                 |
|----|------------|-------------|---------|-------------------|
| 1: | Aperture Stop | 17.3     | 1       |                   |
| 2: | ∞          | 59.8        | 1.50846 | G111              |
| 3: | ∞          | 20.3        | 1       |                   |
| 4: | ∞          | 21.1        | 1.50846 | G112              |
| 5: | −51.67880  | 0.5         | 1       |                   |
| 6: | 67.93790   | 18.4        | 1.50846 | G113              |
| 7: | ∞          | d7: variable| 1       |                   |
| 8: | −40.08378  | 4.5         | 1.50846 | G114              |
| 9: | 64.15514   | d9: variable| 1       |                   |
| 10:| ∞          | 27.0        | 1.50846 | G115              |
| 11:| −78.73668  | 0.5         | 1       |                   |
| 12:| 73.17649   | 19.3        | 1.50846 | G116              |
| 13:| 147.70793  | d13: variable| 1      |                   |
| 14:| −59.72408  | 5.8         | 1.50846 | G117              |
| 15:| −703.48443 | 82.0        | 1       |                   |
| 16:| ∞          | 125.0       | 1       | Path Bend Portion |
| 17:| 187.48807  | 26.4        | 1.50846 | G118              |
| 18:| ∞          | 67.0        | 1       |                   |
| Evaluation Surface | ∞ |        |         |                   |

Focal Length and Variable Interval at Positions

| Position | P1      | P2    | P3     | Focal Length of Groups |
|----------|---------|-------|--------|------------------------|
| F1       | 12292.2 | 454.6 | 258.9  | f1 = +57.85 mm         |
| d7       | 27.0    | 33.2  | 40.6   | f2 = −47.90 mm         |
| d9       | 118.1   | 70.4  | 44.35  | f3 = +94.86 mm         |
| d13      | 54.5    | 96.0  | 114.65 | f4 = +368.74 mm        |
| S1       | 26.0    | 43.8  | 64.0   | \|f2/f3\| = 0.505      |

Position of Intersection Point between Principal Ray of Abaxial Light and Optical Axis H1 = 25.6 mm
H2 = 12.9 mm
H3 = 2.5 mm Re-collected Position of Secondary Light Source (Distance from the 9th Surface)

L1 = 60.3 mm
L2 = 35.3 mm
L3 = 5.2 mm

In Table 1 above, P1 means the smallest σ position, P2 means the intermediate σ position, and P3 means the largest σ position. Also, F1 is the focal lengths of the first optical system at the respective σ positions, while f1, f2, f3 and f4 are focal lengths of the first, second, third and fourth lens groups, respectively. Furthermore, d7 denotes the variable spacing between the fist lens group and the second lens group along the optical axis; d9 denotes the variable spacing between the second lens group and the third lens group along the optical axis; and d3 denotes the variable spacing between the third lens group and the concave lens G117 along the optical axis.

Further, S1 denotes the light beam diameter upon a certain evaluation plane which is at a distance 67 mm from the last surface of the first optical system, as defined after the parallel light impinging on an aperture stop 119 having an opening diameter φ 10 mm passes through the re-imaging optical system of this embodiment. Also, H1, H2 and H3 each denotes the position of intersection point 118 between the optical axis 115 and the principal ray 117 of abaxial light at the respective σ positions, and each represents the distance from the ninth surface which is the light exit side surface of the concave lens G114.

Also, L1, L2 and L3 each denotes the light re-collecting position 116 where, in the respective σ position, light emitted from the secondary light source position 113 is re-collected. It corresponds to the distance from the ninth surface which is the light exit side surface of the concave lens G117, in a case where the length of the rod-like glass 111 is made equal to 450 mm and the distance from the secondary light source position 113 to the light entrance end of the rod-like glass 111 is made equal to 15 mm. Furthermore, r denotes the curvature radius of each surface (unit is mm); d denotes the spacing between adjacent surfaces (unit is mm); n is the refractive index of the medium with respect to the incident light (wavelength is 0.248 μm); and k denotes the lens number of the re-imaging optical system as seen in FIG. 2.

Figure 3:
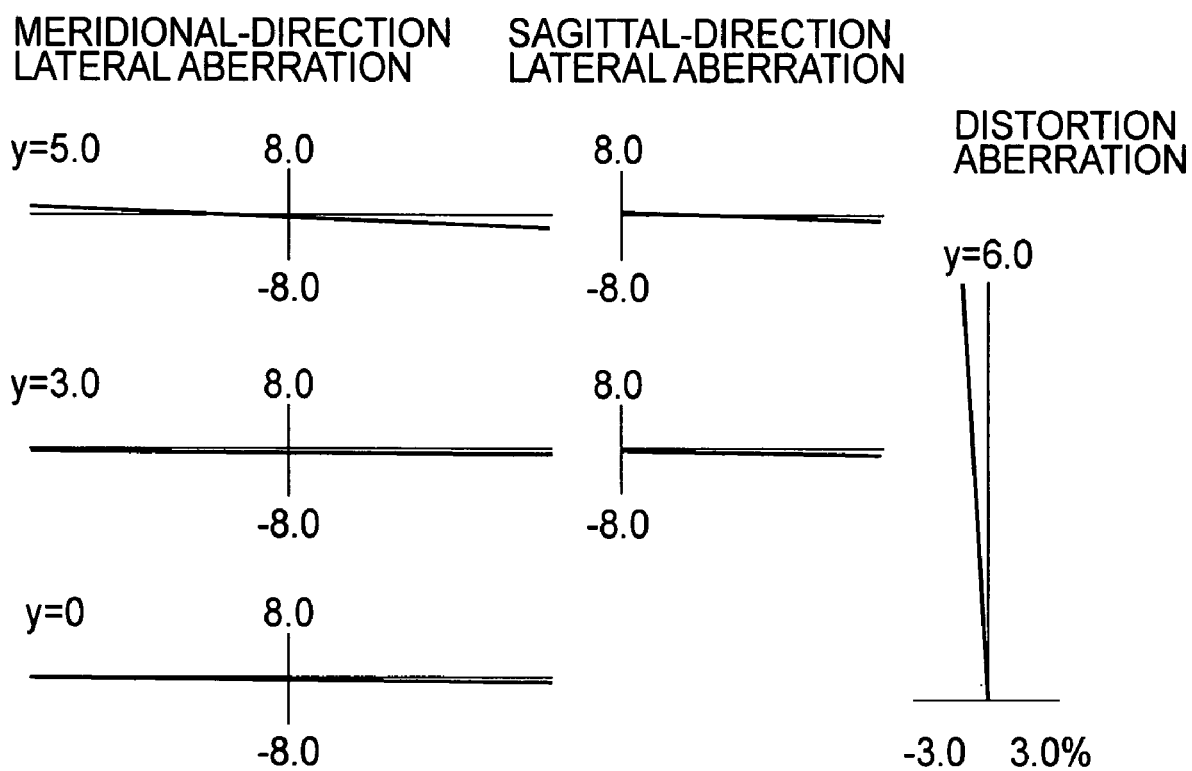
FIG. 3 is an aberration chart related to a smallest σ position P1 of the re-imaging optical system of the first embodiment of the present invention.
Figure 4:
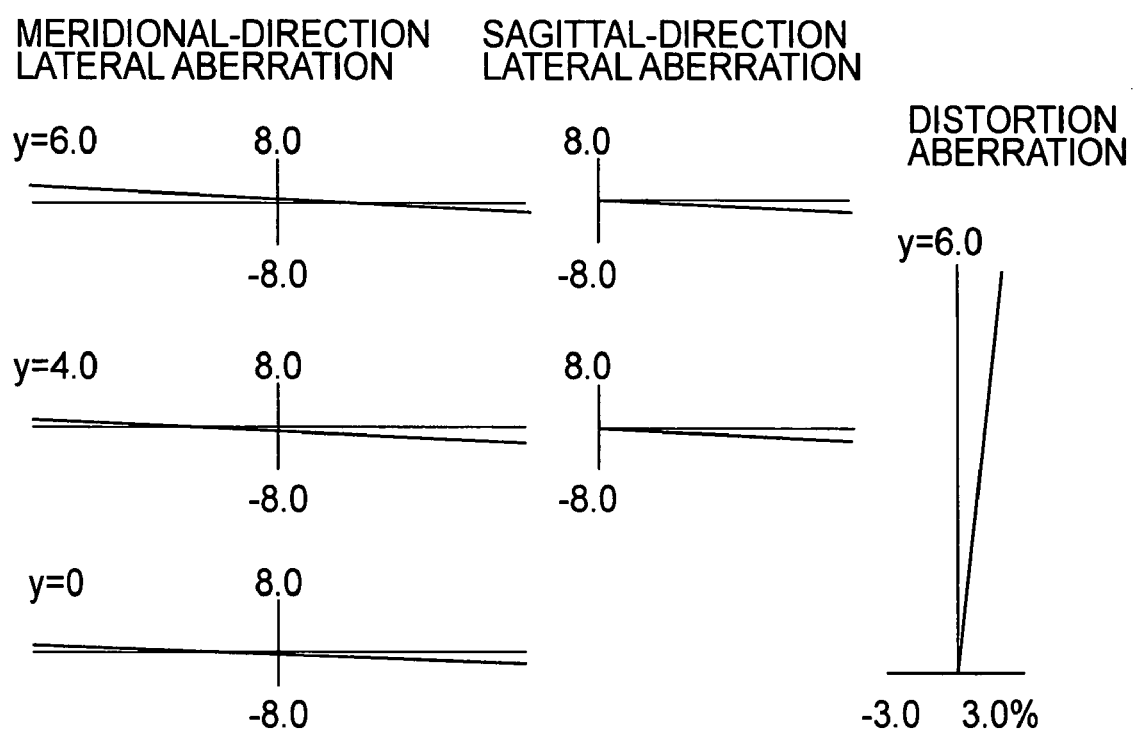
FIG. 4 is an aberration chart related to a largest σ position P3 of the re-imaging optical system of the first embodiment of the present invention.

FIG. 3 is an aberration chart for explaining transverse aberration in meridional direction and transverse aberration in sagittal direction as well as distortion aberration of the re-imaging optical system used in the first embodiment, produced at the smallest σ position P1 thereof. FIG. 4 is an aberration chart for explaining transverse aberration in meridional direction and transverse aberration in sagittal direction as well as distortion aberration of the re-imaging optical system used in the first embodiment, produced at the largest σ position P3 thereof. It is seen from these drawings that the distortion aberration is satisfactorily collected while the transverse aberrations are well suppressed within a practically allowable range.

In accordance with the first embodiment of the present invention as described above, the fist moving group consists of a single concave lens, while the second moving group consists of two convex lenses. The point of intersection between the optical axis and the principal ray of abaxial light is placed between the first and second moving groups, and the moving group structure having been described with this embodiment is adopted. With this arrangement, a continuously-variable illumination range optical system can be accomplished which enables: (i) the range of illumination with emitted light can be changed continuously even by use of a very simple magnification changing optical system having two moving groups; (ii) the telecentricity of emitted light can be maintained at a level free of any practical inconveniences, without stagnating the light re-collecting position inside any optical element; (iii) while on the other hand, transverse aberration can be well suppressed within a practically allowable range and, moreover, distortion aberration can be corrected satisfactorily.

Figure 15:
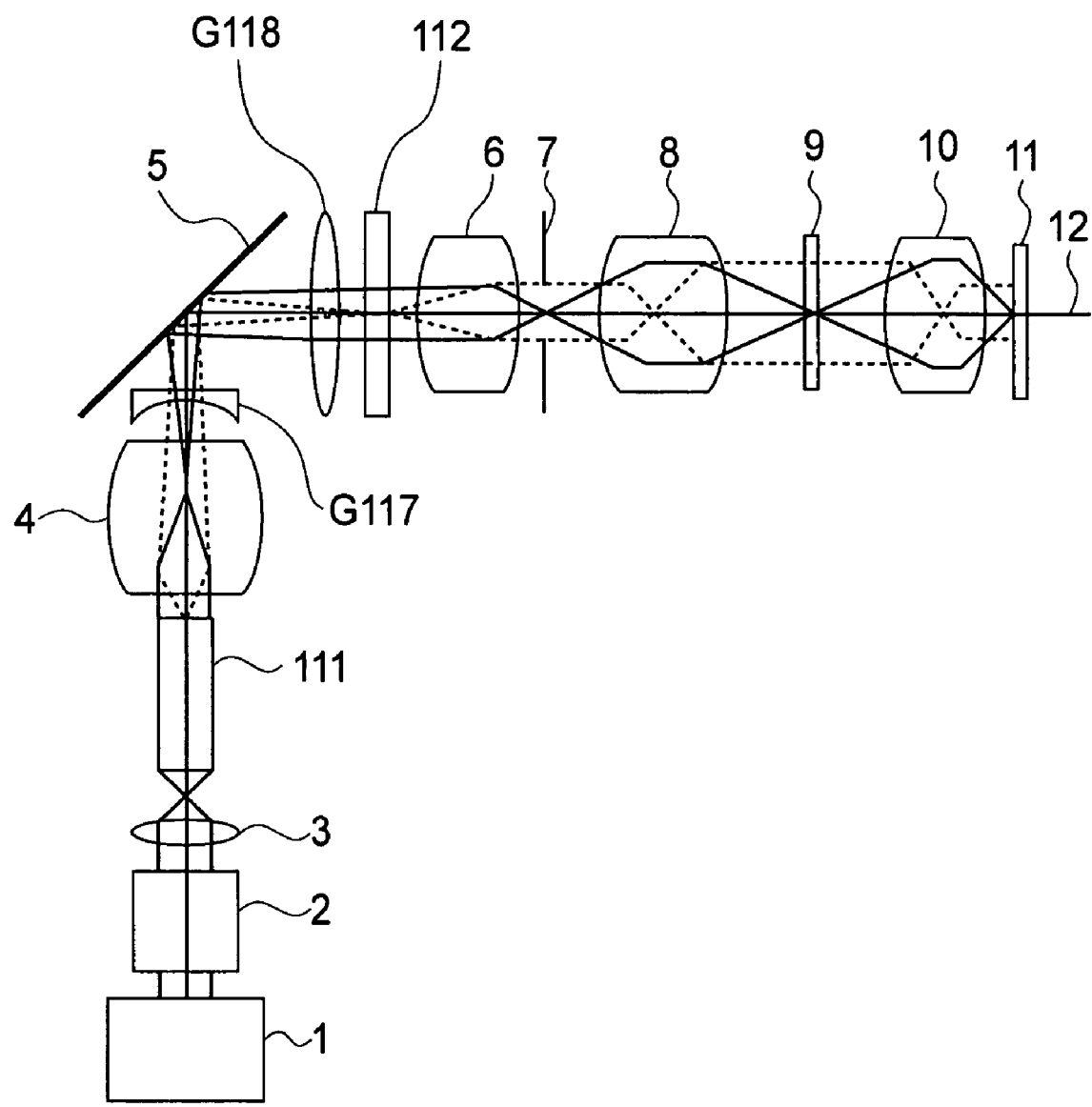
FIG. 15 is a schematic view of an embodiment wherein the re-imaging optical system according to the first embodiment is incorporated into a projection optical system as a σ continuous changing optical system.

The re-imaging optical system according to the present embodiment can be incorporated into a step-and-repeat type projection exposure apparatus such as shown in FIG. 15, for example, as a σ continuously changing optical system, for example. In FIG. 15, light emitted from a light source which comprises an excimer laser 1 having an emission wavelength 248 nm goes through a beam shaping optical system 2 by which it is transformed into a desired beam shape. The light is subsequently directed and projected onto a rod-like glass 111 having a hexagonal sectional shape, by means of a first relay optical system 3.

The rod-like glass 111 has a function as plural-light-source forming means (integrator), and it serves to produce a plurality of light sources from a single light source on the basis of multiple reflections by the inner glass surfaces thereof. Light from this rod-like glass 111 is projected onto a fly's eye lens 112 by means of the σ continuously changing optical system.

Here, the σ continuously changing optical system is provided by a magnification changing optical system 4 having lenses G114–G116 described with reference to the first embodiment, a concave lens G117, a mirror 5 for bending the optical axis 12 at a right angle within a sectional plane that contains the scan direction and the optical axis 12, and a convex lens G118.

Light from the fly's eye lens 112 is directed to a mask 7 by a second relay optical system 6, so as to Koehler illuminate the mask 7 surface. Light passed through an opening of the mask 7 is directed to a reticle 9 by means of a mask imaging optical system 8, to illuminate the reticle 9. Here, the mask 7 and the reticle 9 are placed in an optically conjugate relationship. Thus, a circuit pattern formed on the reticle 9 is projected in a reduce scale onto a wafer 11 (substrate) surface having a photosensitive material applied thereto, by means of a projection optical system 10.

By using a structure such as described above to introduce a σ continuously changing optical system of this embodiment into an illumination optical system, a projection optical system which enables further extension of σ-value variable range can be accomplished, without placing a light re-collecting position having a largest light energy density inside any lens elements, while on the other hand satisfying limitational conditions for structure and for optical materials by use of reduced number of lenses and with use of a simplified and compact structure.

[Embodiment 2]

Figure 5:
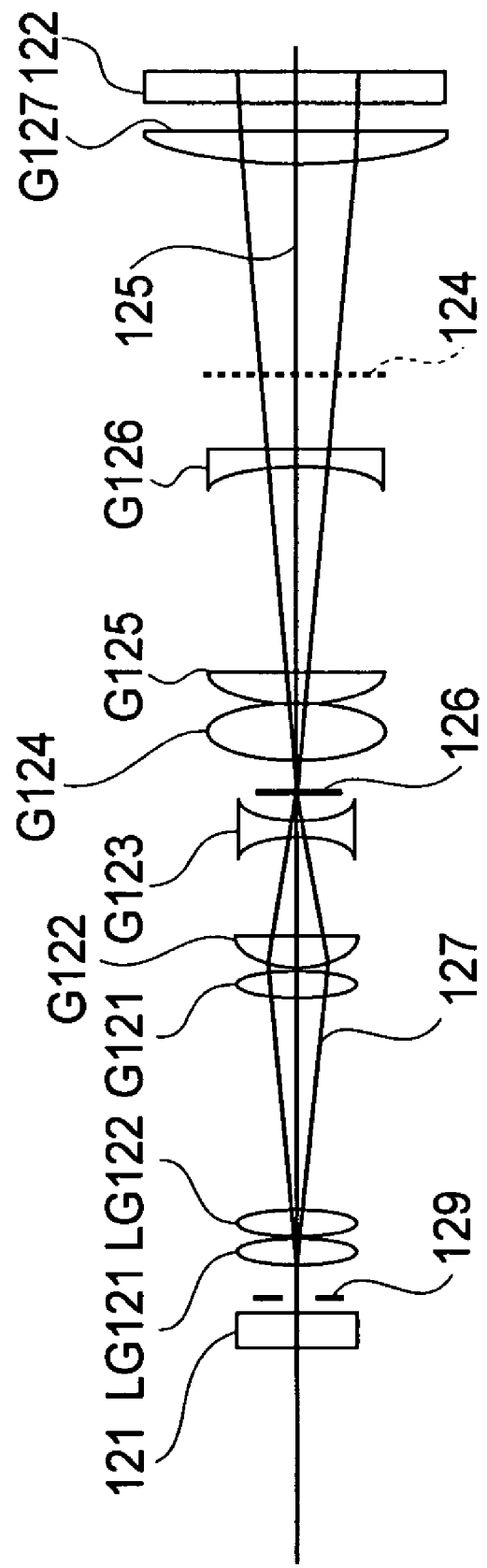
FIG. 5 is a schematic view of an illumination optical system according to a second embodiment of the present invention.

Referring to FIGS. 5–8, a second embodiment of the present invention will be described. As shown in FIG. 5, this embodiment is an example wherein a relay optical system having two convex lenses G121 and G122 as well as a re-imaging optical system having a function for imaging, upon an image plane, an object plane onto which light from the relay optical system is projected, are disposed between a first fly's eye lens 121 and a second fly's eye lens 122, in an order from the light entrance side thereof. This re-imaging optical system has a function for continuously changing the extension of illuminating range upon the image plane. The first and second fly's eye lenses 121 and 122 are placed approximately in a Fourier transform positional relationship with each other.

The position where light from a light source which is defined at a light collecting position placed just after the first fly's eye lens 121, is the light re-collection position where the light energy becomes largest. The second embodiment is an example of re-imaging optical system which is arranged so that the light re-collecting position is defined out of any lens elements.

FIG. 5 illustrates the re-imaging optical system of this embodiment as being placed in the state in which the range of illumination upon the image plane becomes largest, that is, the state of largest σ. The re-imaging optical system comprises a first lens group consisting of two convex lenses G121 and G122, a second lens group consisting of a single concave lens G123 only, a third lens group consisting of convex lenses G124 and G125, and a fourth lens group consisting of a single convex lens 127 disposed after a concave lens G126. There is a light path bending portion 124 provided between the concave lens G126 and the convex lens G127.

The power of the first lens group and the spacing between principal points of the first and second lens groups are determined so that the point of intersection between the optical axis 125 and the principal ray 127 of abaxial light is defined between the concave lens G123 and the convex lens G124. For, with this arrangement, the light re-collecting position 126 where light from the light source defined at the light collecting position placed just after the first fly's eye lens 121 is re-collected and where the light energy density becomes largest can be present in registration with the intersection point position 128 between the optical axis 125 and the principal ray 127 of abaxial light, and it can be present between the concave lens G123 and the convex lens G124 in the largest σ state.

Figure 6:
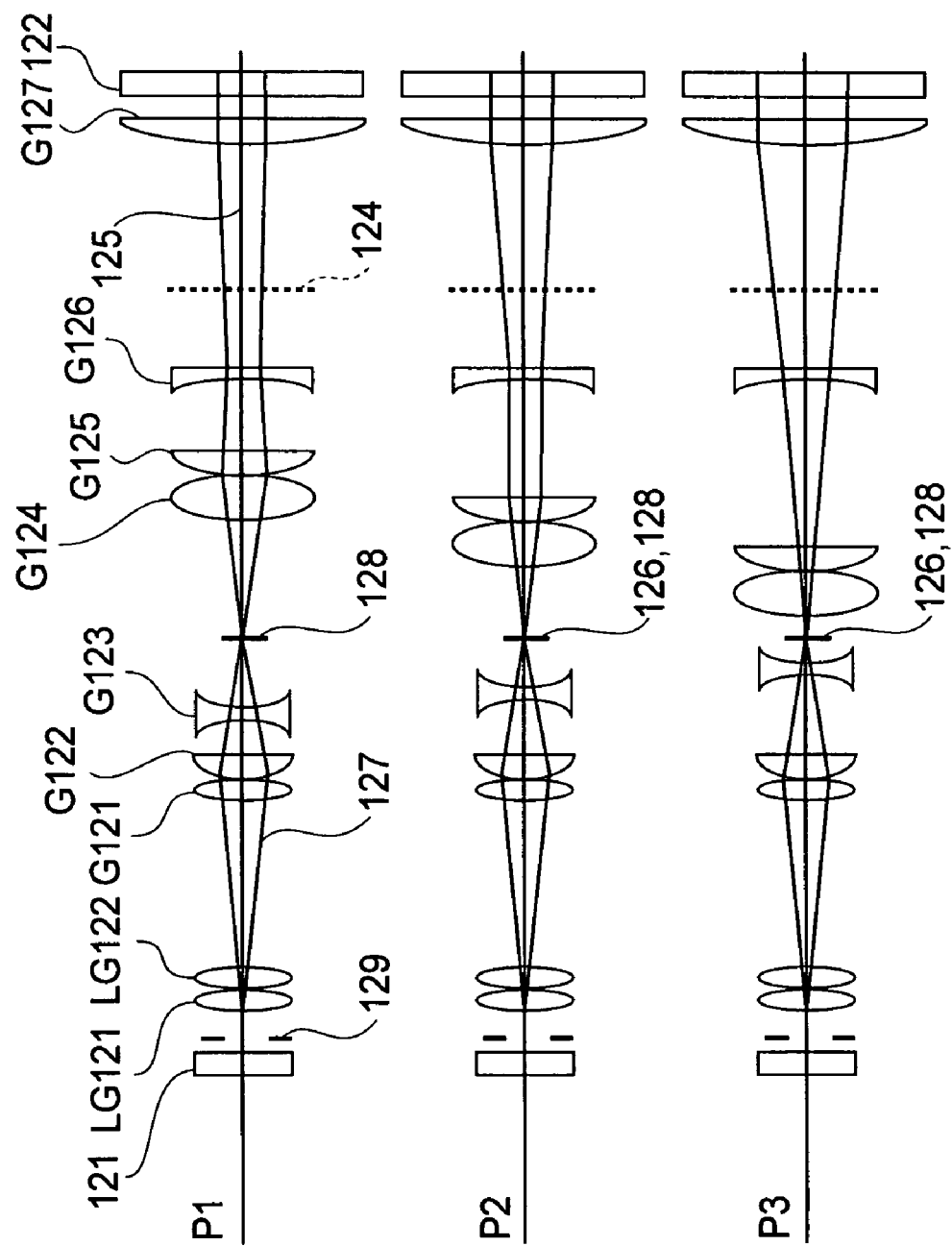
FIG. 6 is a schematic view for explaining magnification change in a re-imaging optical system used in the second embodiment of the present invention.

In the structure described above, variable-magnification positions are provided as shown in FIG. 6 while taking the second lens group comprising concave lens G123 as a first movable group and taking the third lens group comprising convex lenses G124 and G125 as a second movable group. Where the extension of illumination range on the image plane should be made small, that is, if σ value is going to be made small, the second lens group is displaced toward the light entrance side, while on the other hand the third lens group is displaced toward the light exit side of the re-imaging optical system.

Hence, a variable illumination range optical system can be accomplished by which the extension of illumination range on the image plane can be changed continuously, with the intersection point position 128 between the optical axis 125 and the principal ray 127 of abaxial light, that is, the light re-collecting position being kept placed in a space between the concave lens G123 and the convex lens G124, while on the other hand the back focus position can be maintained at a level practically without any inconveniences. In FIG. 6, the smallest σ position is illustrated as P1, an intermediate σ position is illustrated as P2, and the largest σ position is illustrated as P3, respectively.

Thus, in the re-imaging optical system of this embodiment, throughout the whole magnification changing range thereof it is assured that the light re-collecting position 126 is prevented from being placed inside any lens elements. In other words, throughout the whole magnification changing range thereof it is assured that the zone where the light energy density becomes largest is defined out of any lens elements.

In this embodiment, an afocal optical system that comprises concave lens G126 and convex lens G127, disposed in an order from the light entrance side, is provided after the second movable group. With this arrangement, the parallelism, with respect to the optical axis, of a principal ray of abaxial light directed to the second fly's eye lens 122, namely, the telecentricity, can be maintained at a level without any practical inconveniences.

In order to maintain the uniformness of light to be projected onto the second fly's eye lens 122, or for suppression of distortion aberration, particularly, for suppression of the amount of change of distortion aberration due to magnification change toward the large-σ side, it is desirable that, in the lens group at the light entrance side which constitutes the second movable group and which has a negative power, the curvature of the surface at the light entrance side is made larger than the curvature of the surface at the light exit side and also that there is a concave lens G126 present which lens has a concave surface facing toward the light entrance side.

Table 2 below shows numerical values of the specification of the re-imaging optical system used in the second embodiment.

TABLE 2

λ = 0.193 µm, Aperture Stop Opening (Diameter) = 12 mm
Largest Angle of Incident Light on Aperture Stop (Half Size) = 5.7 deg.

|     | r          | d           | n       | k              |
|-----|------------|-------------|---------|----------------|
| 1:  | Aperture Stop | 15.1     | 1       |                |
| 2:  | 174.61808  | 22.0        | 1.50413 | LG121          |
| 3:  | −49.88733  | 0.5         | 1       |                |
| 4:  | 82.47264   | 14.0        | 1.50413 | LG122          |
| 5:  | −144.28045 | 106.9       | 1       |                |
| 6:  | 113.20000  | 36.0        | 1.50413 | G121           |
| 7:  | −70.00000  | 1.0         | 1       |                |
| 8:  | 70.00000   | 30.0        | 1.50413 | G122           |
| 9:  | −6789.50000 | d9: variable | 1     |                |
| 10: | −49.56023  | 4.5         | 1.50413 | G123           |
| 11: | 51.02448   | d11: variable | 1     |                |
| 12: | 146.36947  | 42.0        | 1.50413 | G124           |
| 13: | −115.11405 | 0.5         | 1       |                |
| 14: | 76.07736   | 20.0        | 1.50413 | G125           |
| 15: | 114.68230  | d15: variable | 1     |                |
| 16: | −58.38708  | 6.0         | 1.50413 | G126           |
| 17: | −450.67883 | 82.0        | 1       |                |
| 18: | ∞          | 125.0       | 1       | Path Bend Portion |
| 19: | 194.39885  | 30.7        | 1.50413 | G127           |
| 20: | ∞          | 69.5        | 1       |                |
| Evaluation Surface | ∞ |          |         |                |

Focal Length and Variable Interval at Positions Focal Length of Groups

| Position | P1     | P2     | P3     | fL1 = +47.62 mm |
|----------|--------|--------|--------|-----------------|
| F1       | −169.2 | −316.0 | −542.7 | f1 = +58.15 mm  |
| d9       | 28.0   | 34.4   | 41.8   | f2 = −49.40 mm  |
| d11      | 106.5  | 57.0   | 30.0   | f3 = +93.65 mm  |
| d15      | 54.2   | 97.3   | 116.9  | f4 = +387.69 mm |
| S1       | 33.0   | 58.2   | 84.6   | $|f2/f3| = 0.501$ |

Position of Intersection Point between Principal Ray of Abaxial Light and Optical Axis; that is, Re-collected Position of Secondary Light Source (Distance from the 11th Surface)

H1 = L1 = 41.0 mm
H2 = L2 = 23.29 mm
H3 = L3 = 9.6 mm

In Table 2 above, P1 means the smallest σ position, P2 means the intermediate σ position, and P3 means the largest σ position. Also, F1 is the focal lengths of a combined optical system provided by a relay optical system and the re-imaging optical system of the present embodiment, corresponding to respective σ positions. fL1 is the focal length of the relay optical system, and f1, f2, f3 and f4 are focal lengths of the first, second, third and fourth lens groups, respectively.

When the focal length of the second lens group is f2 and the focal length of the third lens group is f3, a relation $$|f2/f3|=0.501$$

is satisfied there. If $|f2/f3|$ become less than the aforementioned value, it becomes difficult to suppress various aberrations described above to practical level or lower, while placing the light re-collecting position between the second and third lens groups.

Further, d9 denotes the variable spacing between the fist lens group and the second lens group along the optical axis; d11 denotes the variable spacing between the second lens group and the third lens group along the optical axis; and d15 denotes the variable spacing between the third lens group and the concave lens G126 along the optical axis.

Furthermore, S1 denotes the light beam diameter upon a certain evaluation plane which is at a distance of 69.5 mm from the last surface of the re-imaging optical system, as defined after a divergent light beam having NA of 0.1, that is, having a half size of largest angle being equal to 5.7 deg., emerging from the optical axis center of an aperture stop 129 having an opening diameter 12 mm, entered the re-imaging optical system of this embodiment.

Also, H1, H2 and H3 each denotes the position of intersection point 128 between the optical axis 125 and the principal ray 127 of abaxial light at the respective a positions, and each represents the distance from the eleventh surface which is the light exit side surface of the concave lens G123. Further, L1, L2 and L3 each denotes the light re-collecting position 126 where, in the respective σ position, light having been emitted from the light source defined by collected light just after being emitted from the first fly's eye lens 121 and having entered the re-imaging optical system of this embodiment is re-collected. It corresponds to the distance from the eleventh surface which is the light exit side surface of the concave lens G123. As described hereinbefore, the intersection point position 128 and the light re-collecting position 126 are registered with each other, and thus H1=L1, H2=L2 and H3=L3.

Furthermore, r denotes the curvature radius of each surface (unit is mm); d denotes the spacing between adjacent surfaces (unit is mm); n is the refractive index of the medium with respect to the incident light (wavelength is 0.193 µm); and k denotes the lens number of the re-imaging optical system as seen in FIG. 6.

Figure 7:
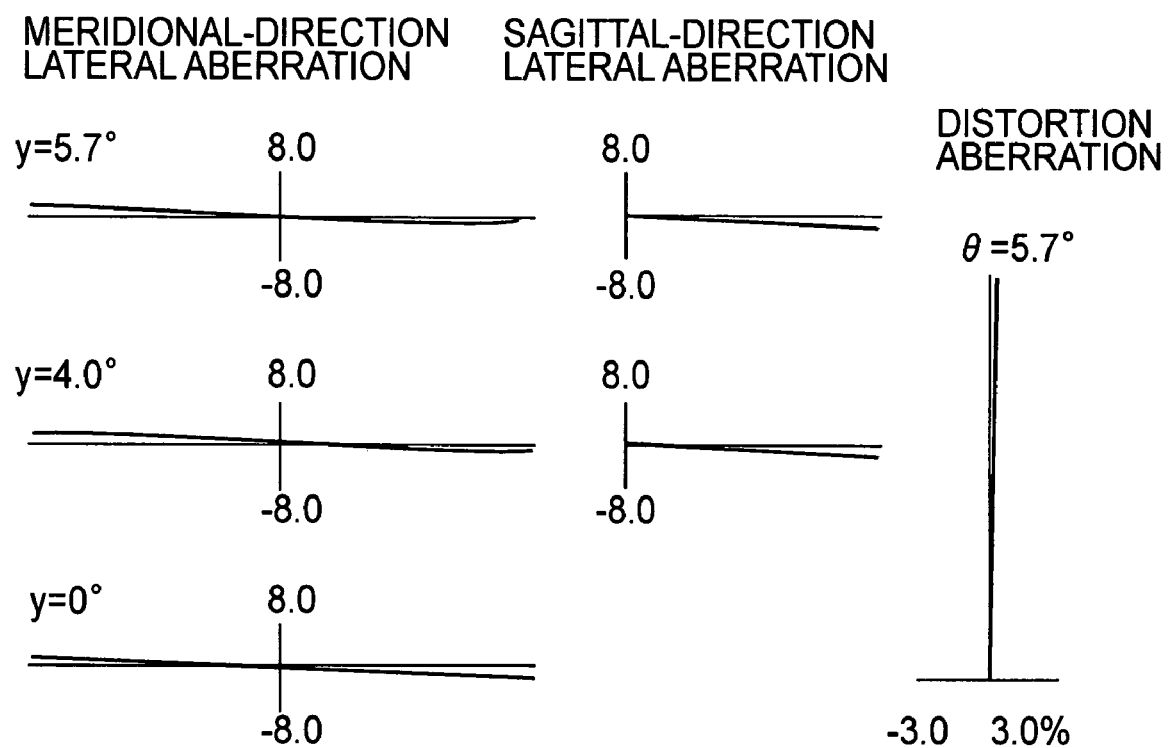
FIG. 7 is an aberration chart related to a smallest σ position P1 of a combined optical system provided by a relay optical system and a re-imaging optical system of the second embodiment of the present invention.
Figure 8:
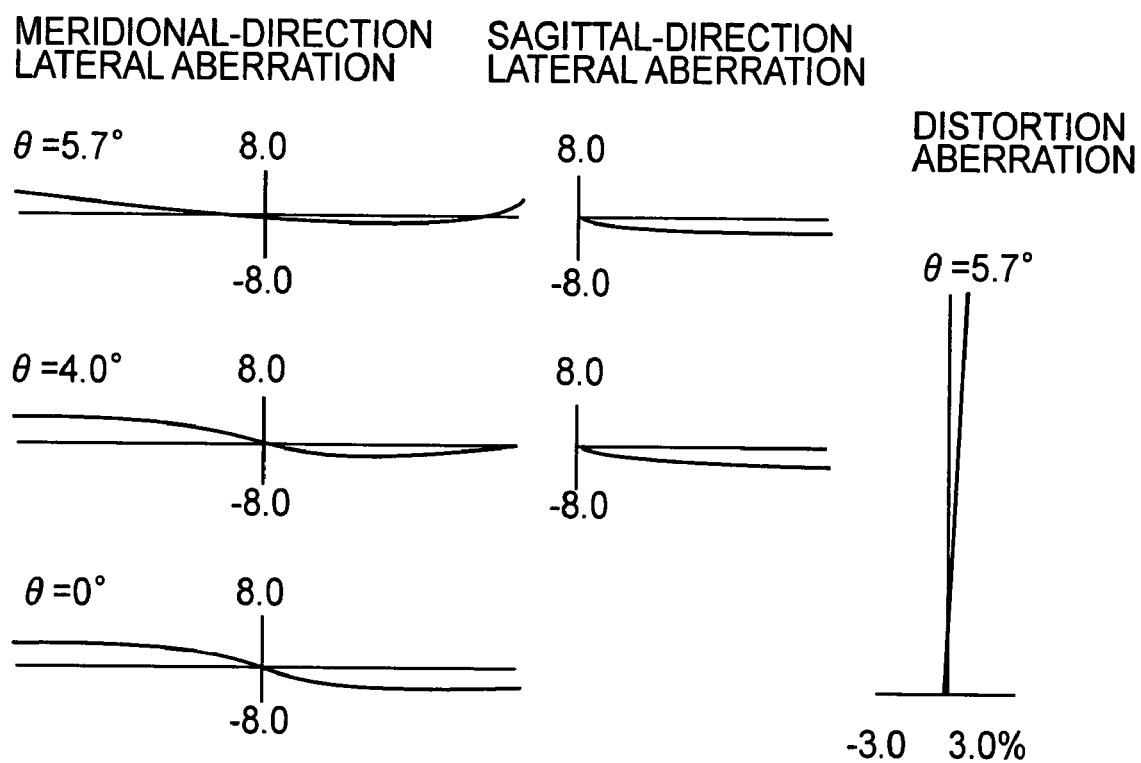
FIG. 8 is an aberration chart related to a largest σ position P3 of the combined optical system provided by a relay optical system and a re-imaging optical system of the second embodiment of the present invention.

FIG. 7 is an aberration chart for explaining transverse aberration in meridional direction and transverse aberration in sagittal direction as well as distortion aberration of the combined optical system of the relay optical system and the re-imaging optical system used in the second embodiment, being produced at the smallest σ position P1 thereof. FIG. 8 is an aberration chart for explaining transverse aberration in meridional direction and transverse aberration in sagittal direction as well as distortion aberration of the combined optical system used in the second embodiment, produced at the largest σ position P3 thereof. It is seen from these drawings that the distortion aberration is satisfactorily collected while the transverse aberrations are well suppressed within a practically allowable range.

In accordance with the second embodiment of the present invention as described above, the fist moving group consists of a single concave lens, while the second moving group consists of two convex lenses. The point of intersection between the optical axis and the principal ray of abaxial light is placed between the first and second moving groups, and the moving group structure having been described with this embodiment is adopted. With this arrangement, a continuously-variable illumination range optical system can be accomplished which enables: (i) the range of illumination with emitted light can be changed continuously even by use of a very simple magnification changing optical system having two moving groups; (ii) the telecentricity of emitted light can be maintained at a level free of any practical inconveniences, without stagnating the light re-collecting position inside any optical element; (iii) while on the other hand, transverse aberration can be well suppressed within a practically allowable range and, moreover, distortion aberration can be corrected satisfactorily.

Figure 16:
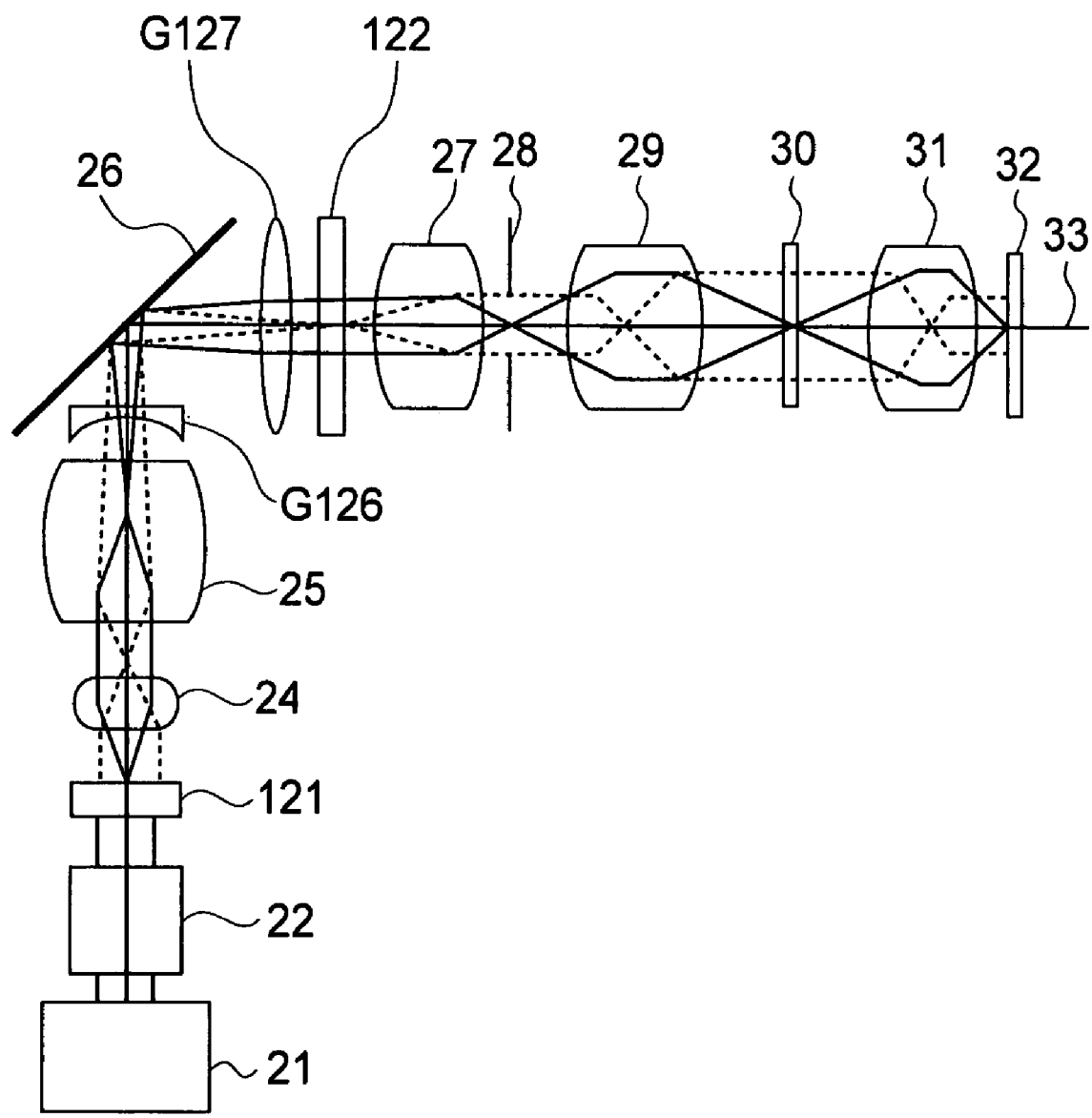
FIG. 16 is a schematic view of an embodiment wherein the re-imaging optical system according to the second embodiment is incorporated into a projection optical system as a σ continuous changing optical system.

The re-imaging optical system according to the present embodiment can be incorporated into a step-and-scan type projection such as shown in FIG. 16, for example, as a σ continuously changing optical system, for example. In FIG. 16, light emitted from a light source which comprises an excimer laser 1 having an emission wavelength 193 nm, for example, goes through a beam shaping optical system 22 by which it is transformed into a desired beam shape. The light is subsequently directed and projected onto a first fly's eye lens 121 having a function as plural-light-source forming means.

Light from the first fly's eye lens 121 is projected onto a second fly's eye lens 122 by means of a relay optical system 24 and the σ continuously changing optical system. The relay optical system 24 is provided by lenses LG121 and LG122 having been described with reference to the present embodiment. Here, the σ continuously changing optical system is provided by a magnification changing optical system 25 having lenses G121–G125 described with reference to the present embodiment, a concave lens G126, a mirror 26 for bending the optical axis 33 at a right angle within a sectional plane that contains the scan direction and the optical axis 33, and a convex lens G127.

Light from the fly's eye lens 122 is directed to a mask 28 by a second relay optical system 27, so as to Koehler illuminate the mask 28 surface. Light passed through the mask 28 is directed to a reticle 30 by means of a mask imaging optical system 29, to illuminate the reticle 30. Here, the mask 28 and the reticle 30 are placed in an optically conjugate relationship. Thus, a circuit pattern formed on the reticle 30 is projected in a reduce scale onto a wafer 31 (substrate) surface having a photosensitive material applied thereto, by means of a projection optical system 31.

By using a structure such as described above to introduce a σ continuously changing optical system of this embodiment into an illumination optical system, a projection optical system which enables further extension of σ-value variable range can be accomplished, without placing a light re-collecting position having a largest light energy density inside any lens elements, while on the other hand satisfying limitational conditions for structure and for optical materials by use of reduced number of lenses and with use of a simplified and compact structure.

[Embodiment 3]

Figure 9:
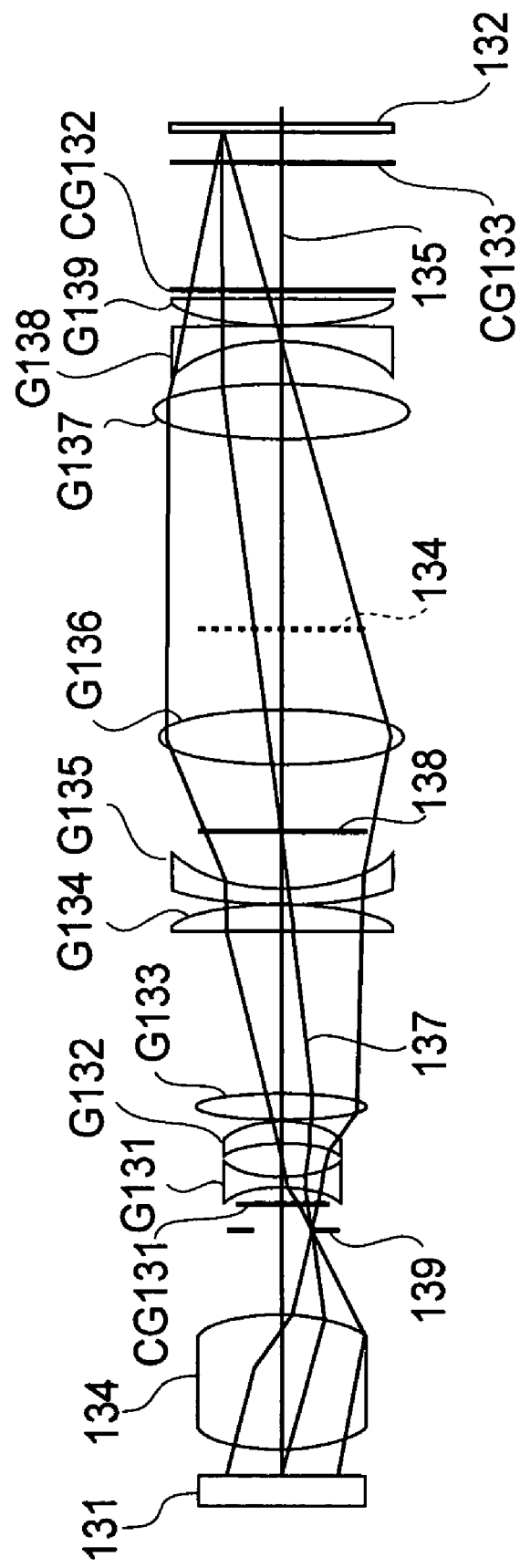
FIG. 9 is a schematic view of an illumination optical system according to a third embodiment of the present invention.
Figure 10:
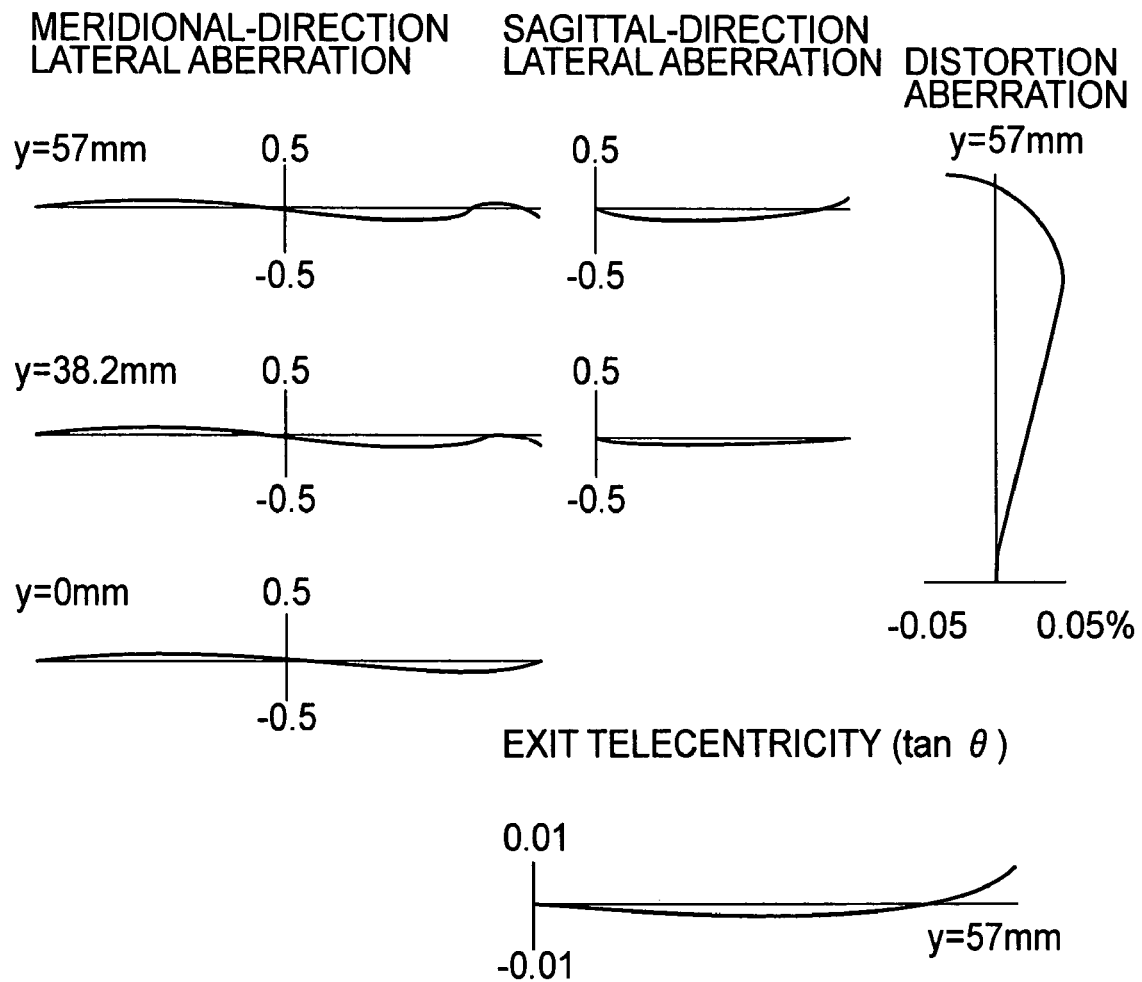
FIG. 10 is an aberration chart related to a re-imaging optical system used in the third embodiment of the present invention.

Referring to FIGS. 9 and 10, a third embodiment of the present invention will be described. As shown in FIG. 9, this embodiment is an example wherein a relay optical system 134 for illuminating a mask 139 surface with light from a fly's eye lens 131 (plural-light-source forming means) as well as a re-imaging optical system for illuminating a reticle 132 surface with light from the mask 139 surface, are disposed between the first fly's eye lens 131 and the reticle 132. Here, the mask 139 surface and the pattern bearing surface of the reticle 132 are placed in an imaging relationship with each other.

The position where light from a light source which is defined at a light collecting position placed just after the fly's eye lens 131, is the light re-collection position where the light energy becomes largest. The third embodiment is an example of re-imaging optical system which is arranged so that the light re-collecting position is defined out of any lens elements.

FIG. 9 illustrates the relay optical system 134 and the re-imaging optical system of this embodiment. The relay optical system 134 comprises a plurality of lens groups and it is an optical system having a function for collecting parallel light incident thereon, adjacent the mask 139 surface. The exit pupil position thereof is placed coincident with the entrance pupil position of the re-imaging optical system which is disposed after the relay optical system.

The re-imaging optical system of this embodiment comprises, in an order from the light entrance side thereof, a cover glass CG131, a first lens group consisting of a concave lens G131 and three convex lenses G132, G133 and G134, a second lens group consisting of a single concave lens G135 only, a third lens group consisting of a single convex lens G136 only, and a fourth lens group consisting of a convex lens G137, a concave lens G138 and a convex lens G139. There is a light path bending portion 134 provided between the third and fourth lens groups, to bend the optical axis 135 at a right angle. Additionally, just before the reticle 132, there is a reticle cover glass CG133 for protection against particles.

The power of the first lens group and the spacing between principal points of the first and second lens groups are determined so that the position 138 of intersection point between the optical axis 135 and the principal ray 137 of abaxial light is defined between the concave lens G135 and the convex lens G136. For, with this arrangement, the light re-collecting position where light from the light source defined at the light collecting position placed just after the fly's eye lens 131 is re-collected and where the light energy density becomes largest can be present in registration with the intersection point position 138 between the optical axis 135 and the principal ray 137 of abaxial light, and it can be present between the concave lens G135 and the convex lens G136. In other words, it is assured that the illumination zone where the energy density becomes largest is prevented from being present inside any lens elements.

Furthermore, in accordance with this embodiment, an optical system of triplet type constituted by convex lens G137, concave lens 138 and convex lens G139 in an order from the light entrance side, is provided as the fourth lens group. With this arrangement, distortion aberration as well as parallelism, with respect to the optical axis, of the principal ray of abaxial light toward the reticle 132, that is, the telecentricity, can be maintained at a satisfactory level.

FIG. 10 illustrates transverse aberration in meridional direction and transverse aberration in sagittal direction as well as distortion aberration and exit side telecentricity of the re-imaging optical system of the third embodiment, wherein incidence NA is 0.3 and the reticle side largest image height is 57 mm. It is seen from this drawing that transverse aberration is well suppressed within a practically allowable range, while distortion aberration is corrected satisfactorily.

If however the amount of curvature of the exit side telecentricity in this embodiment is exceeded, it becomes difficult to register it with the entrance side telecentricity of the projection optical system for imaging the circuit pattern of the reticle 132 surface upon the wafer. The difficulty of this telecentricity correction is dependent upon the object-to-image distance T of the re-imaging optical system, from the mask 139 surface to the reticle 139 pattern surface, as well as the entrance pupil distance P that corresponds to the distance from the mask 139 surface to the entrance pupil of the re-imaging optical system. In this embodiment, since T=1285 mm and P=190 mm, there is a relation P/T=0.148.

Furthermore, in this embodiment, the imaging magnification, that is, the ratio of the extension of the illumination range on the pattern surface of the reticle 132 to the extension of the illumination range on the mask 139 surface, is equal to −1.3×. Making the magnification smaller beyond this value is undesirable because required increases in size of the mask mechanism would cause degradation of the masking precision. Hence, the re-imaging optical system should desirably have an imaging magnification having an absolute value $B_M$ which is not less than 1.3.

Table 3 below shows numerical values of the specification of the re-imaging optical system used in the third embodiment.

TABLE 3

$\lambda$ = 0.193 μm, Imaging Magnification = −1.3x
Incidence NA = 0.3, Largest Image Height = 57 mm

|  | r | d | n | k |
|---|---|---|---|---|
| Object Plane | ∞ | 25.0 | 1 |  |
| 1: | ∞ | 2.0 | 1.56025 | CG131 |
| 2: | ∞ | 26.81 | 1 |  |
| 3: | −82.97266 | 10.0 | 1.56025 | G131 |
| 4: | 366.00921 | 36.75 | 1 |  |
| 5: | −456.68444 | 40.0 | 1.56025 | G132 |
| 6: | −141.43309 | 1.0 | 1 |  |
| 7: | 669.69620 | 32.0 | 1.56025 | G133 |
| 8: | −371.39848 | 200.77 | 1 |  |
| 9: | 3577.18050 | 30.0 | 1.56025 | G134 |
| 10: | −342.48260 | 1.0 | 1 |  |
| 11: | 462.20419 | 13.0 | 1.56025 | G135 |
| 12: | 199.29424 | 118.67 | 1 |  |
| 13: | 309.25354 | 44.0 | 1.56025 | G136 |
| 14: | −980.79534 | 164.0 | 1 |  |
| 15: | ∞ | 210.24 | 1 | Path Bend Portion |
| 16: | 375.62648 | 40.0 | 1.56025 | G137 |
| 17: | −570.34891 | 33.0 | 1.56025 |  |
| 18: | −230.00000 | 12.0 | 1.56025 | G138 |
| 19: | −643.52162 | 1.0 | 1 |  |
| 20: | 593.98404 | 18.0 | 1.56025 | G139 |
| 21: | ∞ | 9.0 | 1 |  |
| 22: | ∞ | 3.5 | 1.56025 | CG132 |
| 23: | ∞ | 187.26 | 1 |  |
| 24: | ∞ | 3.5 | 1.56025 | CG133 |
| 25: | ∞ | 16.15 | 1 |  |
| 26: | ∞ | 6.35 | 1.56025 | Reticle |
| Image Plane | ∞ |  |  |  |

Focal Length of Groups f1 = +323.8 mm    Object to Image Distance: T = 1285 mm
f2 = −636.7 mm    Entrance Pupil Distance: P = +190 mm
f3 = +424.9 mm    P/T = 0.148
f4 = +531.1 mm
|f2/f3| = 1.498

Position of Intersection Point between Principal Ray of Abaxial Light and Optical Axis (Distance from the 12th Surface)

H = 65.2 mm

In Table 3 above, f1, f2, f3 and f4 are focal lengths of the first, second, third and fourth lens groups, respectively.

Here, in this embodiment, when the focal length of the second lens group is f2 and the focal length of the third lens group is f3, a relation

|f2/f3|=1.498 is satisfied there. If |f2/f3| become greater than the aforementioned value, it becomes difficult to suppress various aberrations described above to practical level or lower, while placing the light re-collecting position between the second and third lens groups.

Further, T and P denotes the object-to-image distance and the entrance pupil distance, respectively, described hereinbefore. Also, H denotes the position 138 of intersection point between the optical axis 135 and the principal ray 137 of abaxial light, and it corresponds to the distance from the twelfth surface which is the light exit side surface of the concave lens G135.

Furthermore, in the lens data table above, r denotes the curvature radius of each surface (unit is mm); d denotes the spacing between adjacent surfaces (unit is mm); n is the refractive index of the medium with respect to the incident light (wavelength is 0.193 μm); and k denotes the lens number of the re-imaging optical system as seen in FIG. 9.

In accordance with the third embodiment of the present invention as described above, the point of intersection between the optical axis and the principal ray of abaxial light is placed between a concave lens and a convex lens, and with this arrangement, a re-imaging optical system can be accomplished which enables: (i) the light re-collecting position can be prevented from being defined inside any optical elements yet an optical system having a small number of lens elements is used; (ii) transverse aberration can be well suppressed within a practically allowable range and, moreover, distortion aberration can be corrected satisfactorily; and (iii) the telecentricity of emitted light can be maintained at a level free of any practical inconveniences.

Figure 17:
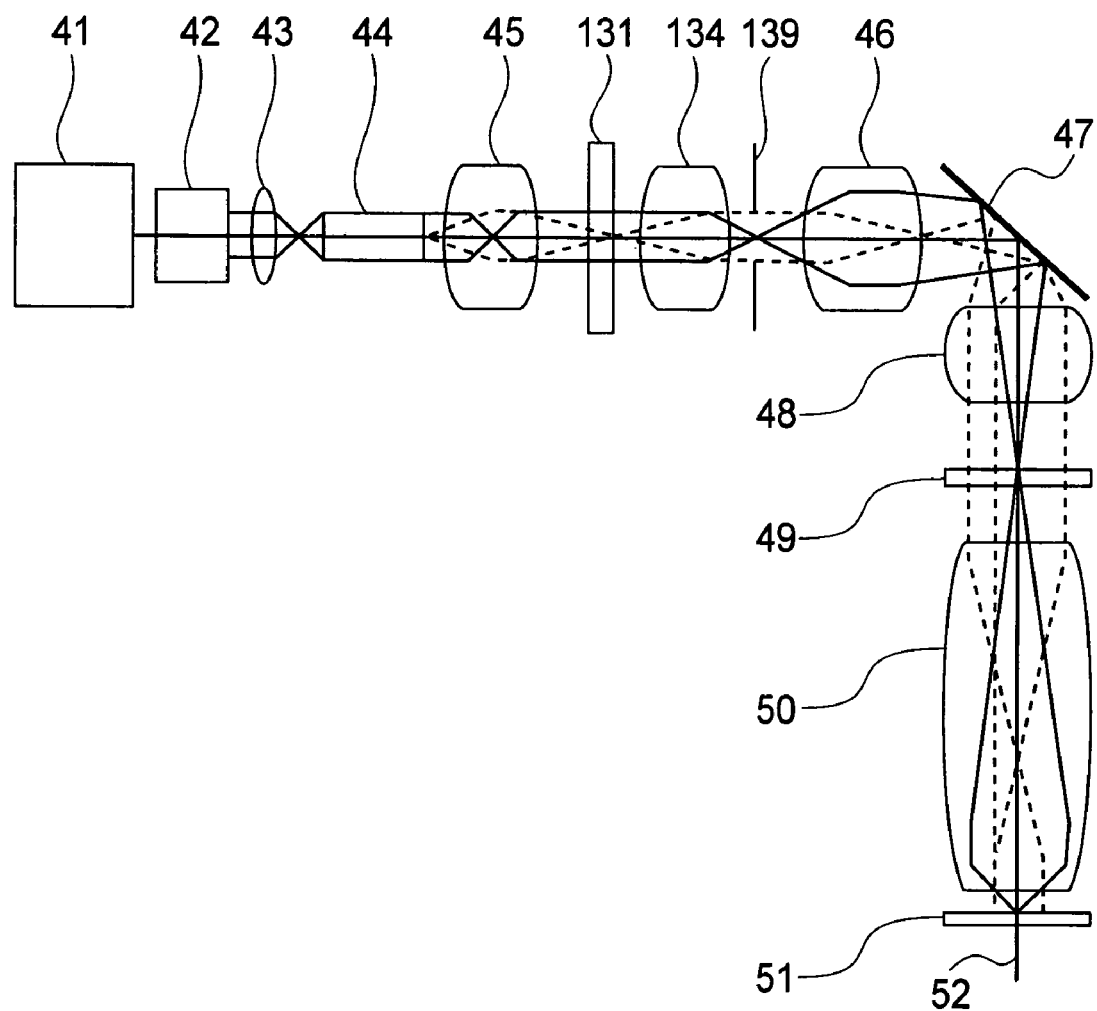
FIG. 17 is a schematic view of an embodiment wherein the re-imaging optical system according to the third embodiment is incorporated into a projection optical system as a mask imaging optical system.

The re-imaging optical system according to the present embodiment can be incorporated into a step-and-scan type projection exposure apparatus such as shown in FIG. 17, for example, as a mask imaging optical system, for example. In FIG. 17, light emitted from a light source which comprises an excimer laser 41 having an emission wavelength 193 nm goes through a beam shaping optical system 42 by which it is transformed into a desired beam shape. The light is subsequently directed and projected onto a rod-like glass 44 having a hexagonal sectional shape, by means of a relay optical system 43.

The rod-like glass 44 serves to produce a plurality of light sources from a single light source on the basis of multiple reflections by the inner glass surfaces thereof. Light from this rod-like glass 44 is projected onto a fly's eye lens 131 by means of a σ continuously changing optical system 45.

Light from the fly's eye lens 131 is directed to a mask 139 surface by a second relay optical system 134, so as to Koehler illuminate the mask 139 surface. Light passed through the mask 139 is directed to a reticle 49 by means of a mask imaging optical system (46, 47, 48) to illuminate the reticle 49. Here, the mask 139 and the reticle 49 are placed in an imaging relationship with each other. Thus, a circuit pattern formed on the reticle 49 is projected in a reduce scale onto a wafer 51 (substrate) surface having a photosensitive material applied thereto, by means of a projection optical system 50.

The mask imaging optical system described above can be replaced by a re-imaging optical system described with reference to the present embodiment. As shown in FIG. 17, the mask imaging optical system comprises a first light collecting optical system 46 consisting of a cover glass CG131 and lens groups G131–G135, a mirror 47 for bending the optical axis 52 at a right angle within a sectional plane that contains the scan direction and the optical axis 52, and a second light collecting optical system comprising an optical system of triplet structure, consisting of a convex lens G137, a concave lens G138 and a convex lens G139 and a cover glass CG132.

Since the entrance NA of the re-imaging optical system of this embodiment is 0.3 and the imaging magnification is −1.3×, it is possible to use such a projection optical system 50 by which the imaging magnification with respect to the reticle surface vs. wafer substrate surface is made equal to −0.25 and the wafer side imaging numerical aperture NA is made equal to 0.92.

By using a re-imaging optical system of the structure such as described above as a mask imaging optical system and by incorporating the same into an illumination optical system, an illumination optical system and a projection exposure apparatus that enables further enlargement of NA of the projection optical system while satisfying limitational conditions for structure and for optical materials, can be accomplished by use of a reduced number of lenses and with use of a simplified and compact structure, and without placing the light re-collecting position, where the light energy density becomes largest, inside any optical elements.

[Embodiment 4]

Figure 11:
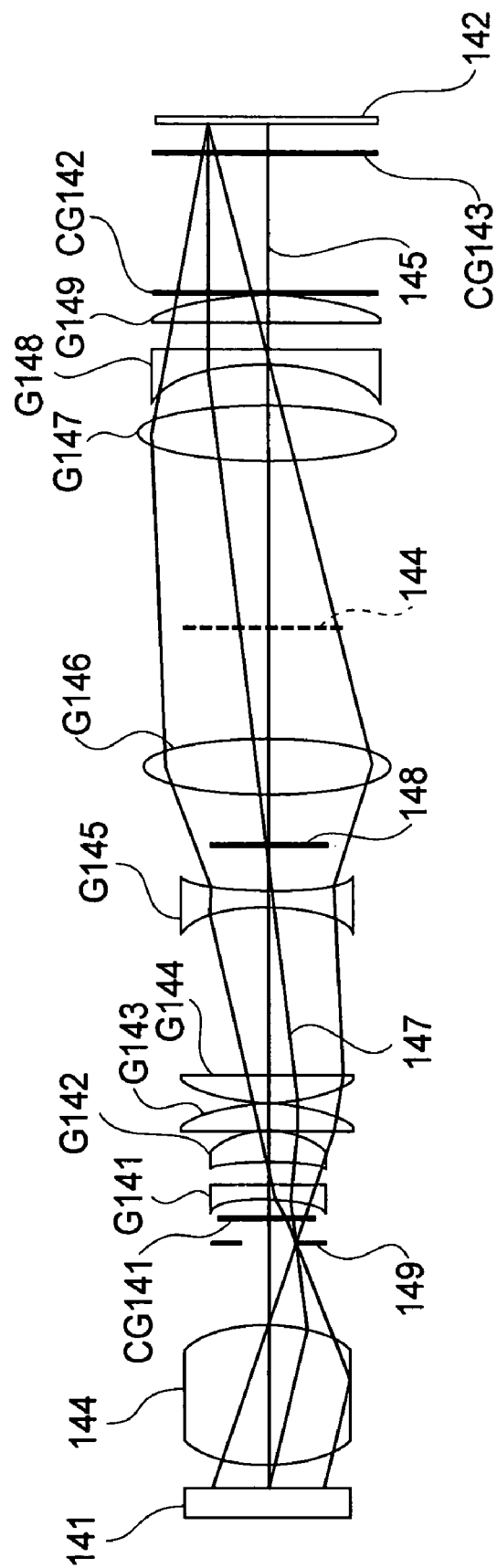
FIG. 11 is a schematic view of an illumination optical system according to a fourth embodiment of the present invention.
Figure 12:
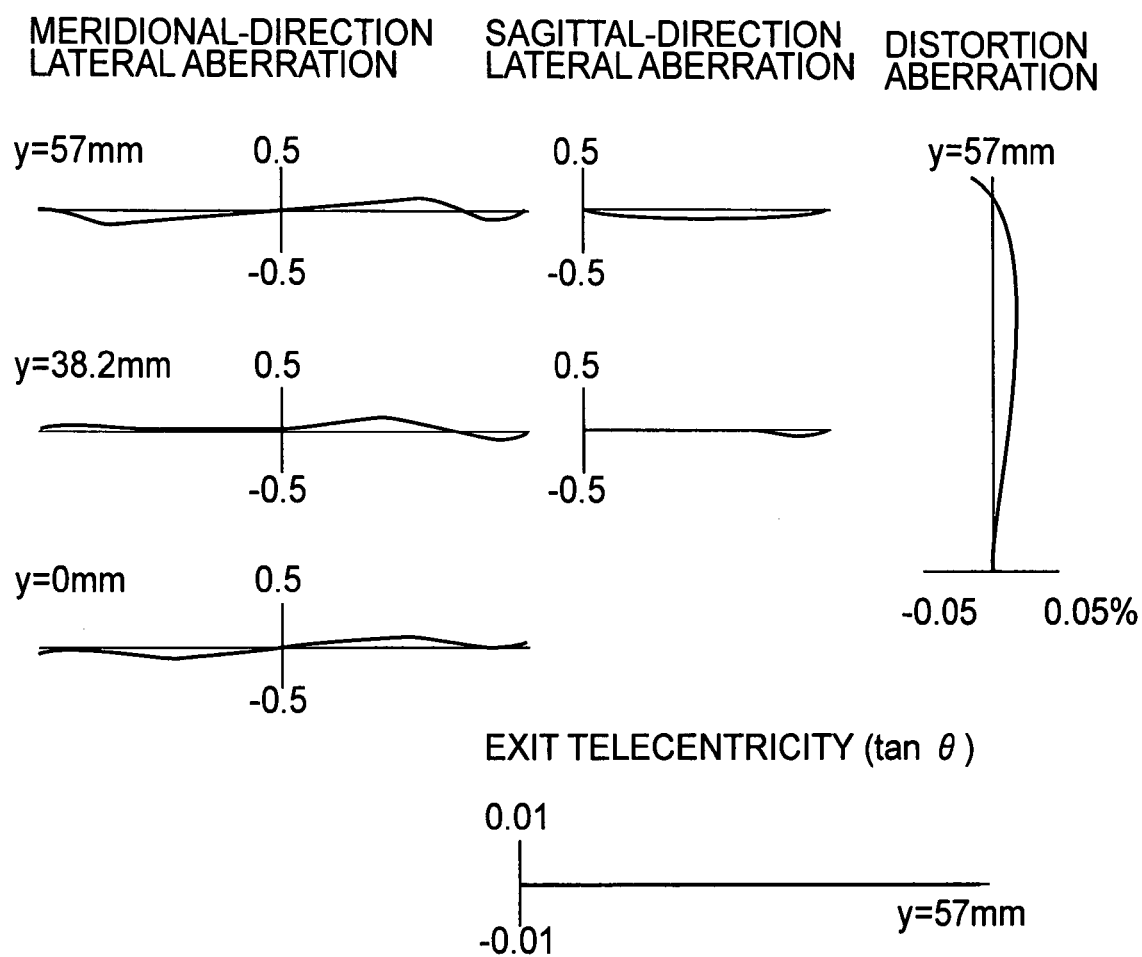
FIG. 12 is an aberration chart related to a re-imaging optical system used in the fourth embodiment of the present invention.

Referring to FIGS. 11 and 12, a fourth embodiment of the present invention will be described. As shown in FIG. 11, this embodiment is an example wherein a relay optical system 144 for illuminating a mask 149 surface with light from a fly's eye lens 141 (plural-light-source forming means) as well as a re-imaging optical system for illuminating a reticle 142 surface with light from the mask 149 surface, are disposed between the first fly's eye lens 141 and the reticle 142. Here, the mask 149 surface and the reticle 142 are placed in an imaging relationship with each other.

The position where light from a light source which is defined at a light collecting position placed just after the fly's eye lens 141, is the light re-collection position where the light energy becomes largest. The fourth embodiment is an example of re-imaging optical system which is arranged so that the light re-collecting position is defined out of any lens elements. Particularly, as compared with the imaging magnification −1.3× of the re-imaging optical system described with reference to the third embodiment of the present invention, the re-imaging optical system of this embodiment has an imaging magnification of −1.6×.

FIG. 11 illustrates the relay optical system 144 and the re-imaging optical system of this embodiment. The relay optical system 144 has a similar structure as of the third embodiment, and it comprises a plurality of lens groups. It is an optical system having a function for collecting parallel light incident thereon, adjacent the mask 149 surface. The exit pupil position thereof is placed coincident with the entrance pupil position of the re-imaging optical system which is disposed after the relay optical system.

The re-imaging optical system of this embodiment comprises, in an order from the light entrance side thereof, a cover glass CG141, a first lens group consisting of a concave lens G141 and three convex lenses G142, G143 and G144, a second lens group consisting of a single concave lens G145 only, a third lens group consisting of a single convex lens G146 only, and a fourth lens group consisting of a convex lens G147, a concave lens G148 and a convex lens G149. There is a light path bending portion 144 provided between the third and fourth lens groups, to bend the optical axis 145 at a right angle. Additionally, just before the reticle 142, there is a reticle cover glass CG143 for protection against particles.

Like the third embodiment, the power of the first lens group and the spacing between principal points of the first and second lens groups are determined so that the position 148 of intersection point between the optical axis 145 and the principal ray 147 of abaxial light is defined between the second lens group G145 and the third lens group G146. For, with this arrangement, the light re-collecting position where light from the light source defined at the light collecting position placed just after the fly's eye lens 141 is re-collected and where the light energy density becomes largest can be present in registration with the intersection point position 148 between the optical axis 145 and the principal ray 147 of abaxial light, and it can be present between the concave lens G145 and the convex lens G146. In other words, it is assured that the illumination zone where the energy density becomes largest is prevented from being present inside any lens elements.

Furthermore, in accordance with this embodiment, like the third embodiment, an optical system of triplet type is provided as the fourth lens group. Namely, by disposing convex lens G147, concave lens G148 and convex lens G149 in an order from the light entrance side, distortion aberration as well as parallelism, with respect to the optical axis, of the principal ray of abaxial light toward the reticle 142, that is, the telecentricity, can be maintained at a satisfactory level.

FIG. 12 illustrates transverse aberration in meridional direction and transverse aberration in sagittal direction as well as distortion aberration and exit side telecentricity of the re-imaging optical system of the fourth embodiment, wherein incidence NA is 0.38 and the reticle side largest image height is 57 mm. It is seen from this drawing that transverse aberration is well suppressed within a practically allowable range, while distortion aberration is corrected satisfactorily.

Table 4 below shows numerical values of the specification of the re-imaging optical system used in the fourth embodiment.

TABLE 4

λ = 0.193 μm, Imaging Magnification = −1.6×
Incidence NA = 0.38, Largest Image Height = 57 mm

|  | r | d | n | k |
|---|---|---|---|---|
| Object Plane | ∞ | 25.0 | 1 |  |
| 1: | ∞ | 2.0 | 1.56025 | CG141 |
| 2: | ∞ | 30.18 | 1 |  |
| 3: | −80.88949 | 10.0 | 1.56025 | G141 |
| 4: | ∞ | 25.00 | 1 |  |
| 5: | −185.58264 | 42.0 | 1.56025 | G142 |
| 6: | −117.25371 | 1.0 | 1 |  |
| 7: | 3073.55177 | 52.0 | 1.56025 | G143 |
| 8: | −195.45084 | 1.0 | 1 |  |
| 9: | 264.68311 | 40.0 | 1.56025 | G144 |
| 10: | ∞ | 151.23 | 1 |  |
| 11: | −340.25780 | 13.0 | 1.56025 | G145 |
| 12: | 410.80049 | 124.96 | 1 |  |
| 13: | 381.20528 | 54.0 | 1.56025 | G146 |
| *14: | −318.14430 | 173.63 | 1 |  |
| 15: | ∞ | 138.0 | 1 | Path Bend Portion |
| 16: | 428.08170 | 44.0 | 1.56025 | G147 |
| 17: | −590.63231 | 48.0 | 1 |  |
| 18: | −224.42875 | 12.0 | 1.56025 | G148 |
| 19: | −1232.49769 | 58.0 | 1 |  |
| 20: | ∞ | 32.0 | 1.56025 | G149 |
| 21: | −295.95667 | 1.1 | 1 |  |
| 22: | ∞ | 3.5 | 1.56025 | CG142 |
| 23: | ∞ | 177.4 | 1 |  |
| 24: | ∞ | 3.5 | 1.56025 | CG143 |
| 25: | ∞ | 16.15 | 1 |  |

TABLE 4-continued

| 26: | ∞ | 6.35 | 1.56025 | Reticle |
|---|---|---|---|---|
| Image Plane | ∞ | | | |

(* is aspherical surface)

Aspherical Coefficient of the 14th Surface

K = −1.130031
A = +1.02497 × $10^{-8}$
B = +4.43684 × $10^{-14}$
C = +4.40854 × $10^{-18}$
D = −2.31502 × $10^{-21}$
E = +2.28358 × $10^{-25}$
F = −6.75364 × $10^{-30}$

Focal Length of Groups

| f1 = +204.9 mm | Object to Image Distance: T = 1285 mm |
|---|---|
| f2 = −330.1 mm | Entrance Pupil Distance: P = +540 mm |
| f3 = +318.4 mm | P/T = 0.420 |
| f4 = +494.3 mm | |
| \|f2/f3\| = 1.037 | |

Position of Intersection Point between Principal Ray of
Abaxial Light and Optical Axis (Distance from the 12th Surface)

H = 97.3 mm

In Table 4 above, f1, f2, f3 and f4 are focal lengths of the first, second, third and fourth lens groups, respectively. Also, T and P denotes the object-to-image distance and the entrance pupil distance, respectively, described hereinbefore. Further, H denotes the position 148 of intersection point between the optical axis 145 and the principal ray 147 of abaxial light, and it corresponds to the distance from the twelfth surface which is the light exit side surface of the concave lens G145.

Furthermore, in the lens data table above, r denotes the curvature radius of each surface (unit is mm); d denotes the spacing between adjacent surfaces (unit is mm); n is the refractive index of the medium with respect to the incident light (wavelength is 0.193 μm); and k denotes the lens number of the re-imaging optical system as seen in FIG. 11.

The coefficients regarding the aspherical surface as shown in Table 4 can be expressed by equation (1) below, when the height of an arbitrary point on the aspherical surface with respect to a direction perpendicular to the optical axis is denoted by h, the distance along the optical axis is denoted by x, the curvature radius at the vertex is r, and the curved surface coefficient is denoted by K, and where the aspherical coefficients are denoted by alphabets A to F, respectively.

$$x = h^2/r/[1 + \{1 - (1+K)(h/r)^2\}^{1/2}] + Ah^4 + Bh^6 + Ch^8 + Dh^{10} + Eh^{12} + Fh^{14} \quad (1)$$

In accordance with the fourth embodiment of the present invention as described above, the point of intersection between the optical axis and the principal ray of abaxial light is placed between a concave lens and a convex lens, and with this arrangement, a re-imaging optical system can be accomplished which enables: (i) the light re-collecting position can be prevented from being defined inside any optical elements yet an optical system having a small number of lens elements is used; (ii) transverse aberration can be well suppressed within a practically allowable range and, moreover, distortion aberration can be corrected satisfactorily; and (iii) the distortion aberration and the exit side telecentricity can be maintained at a level free of any practical inconveniences.

Like the third embodiment, the re-imaging optical system according to the present embodiment can be incorporated into a projection exposure apparatus such as shown in FIG. 17, for example, to be substituted for a mask imaging optical system that comprises a first light collecting optical system 46, a mirror 46, and a second light collecting optical system 48.

Since the entrance NA of the re-imaging optical system of this embodiment is 0.38 and the imaging magnification is −1.6×, it is possible to use such a projection optical system by which the imaging magnification with respect to the reticle surface vs. wafer substrate surface is made equal to −0.25 and the wafer side imaging numerical aperture NA is made equal to 0.95. If the wafer side imaging numerical aperture NA goes beyond this value, the incidence angle or exit angle of light rays at each lens surfaces of the wafer side optical system becomes large. This may cause a problem of degraded reflectance and asymmetrical polarization components when an anti-reflection film is applied to the lens surfaces, and consequently, it may result in unevenness of the linewidth of the printed circuit patterns produced on the wafer substrate. In consideration of this, the imaging side numerical aperture $NA_W$ of the projection optical system should desirably be not greater than 0.95.

By using a re-imaging optical system of the structure such as described above as a mask imaging optical system and by incorporating the same into an illumination optical system, an illumination optical system and a projection exposure apparatus that enables further enlargement of NA of the projection optical system while satisfying limitational conditions for structure and for optical materials, can be accomplished by use of a reduced number of lenses and with use of a simplified and compact structure, and without placing the light re-collecting position, where the light energy density becomes largest, inside any optical elements.

[Embodiment 5]

Figure 13:
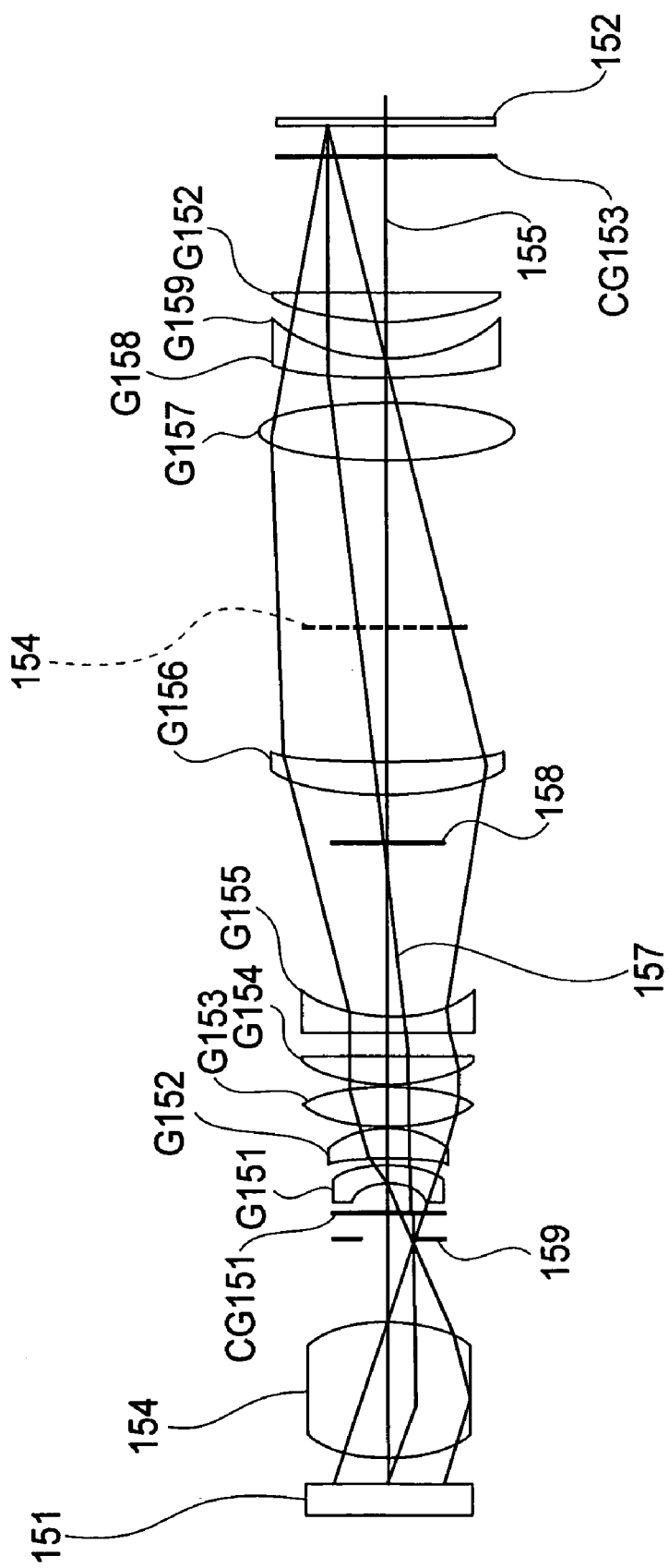
FIG. 13 is a schematic view of an illumination optical system according to a fifth embodiment of the present invention.
Figure 14:
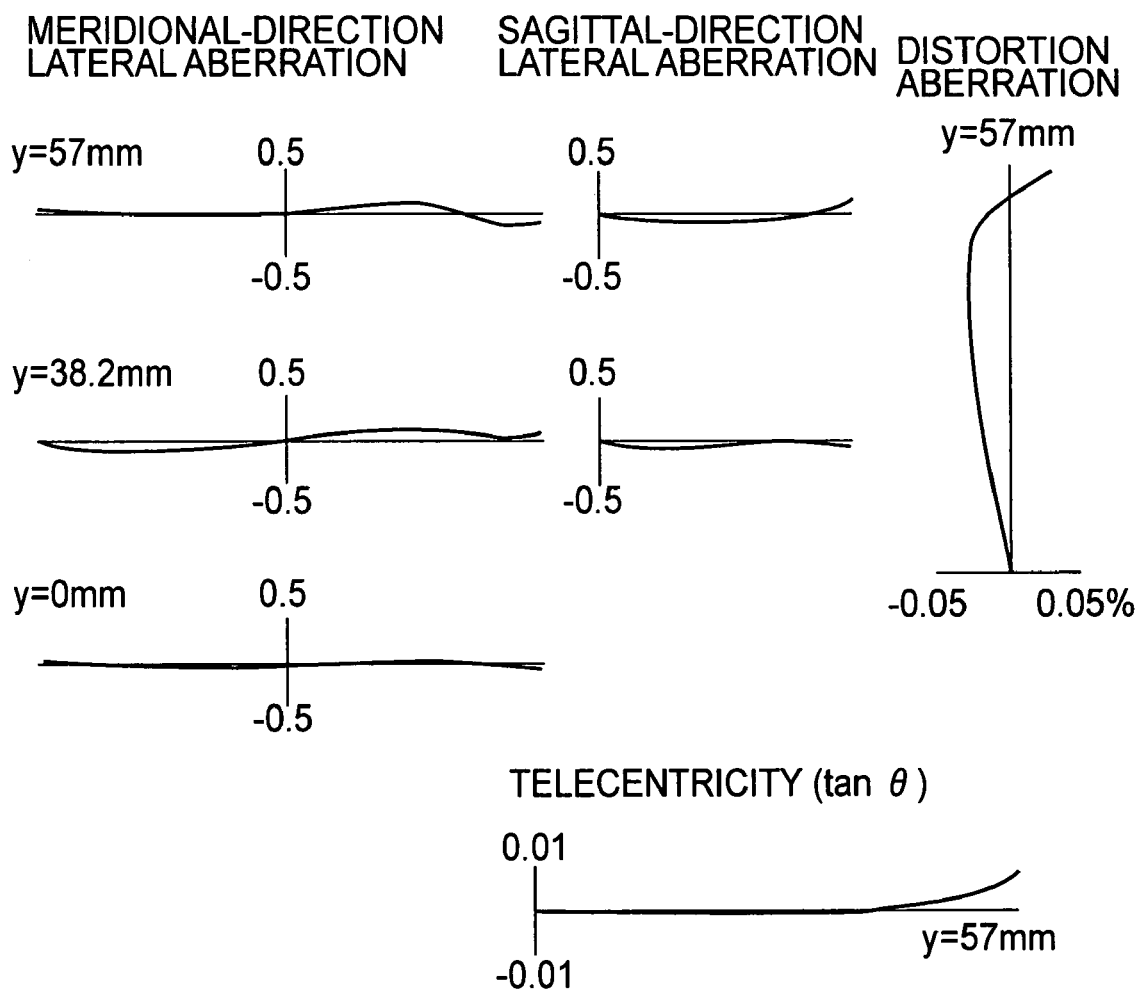
FIG. 14 is an aberration chart related to a re-imaging optical system used in the fifth embodiment of the present invention.

Referring to FIGS. 13 and 14, a fifth embodiment of the present invention will be described. As shown in FIG. 13, this embodiment is an example wherein a relay optical system 154 for illuminating a mask 159 surface as well as a re-imaging optical system for illuminating the pattern bearing surface of a reticle 152 with light from the mask 159 surface, are disposed between a fly's eye lens 151 and the reticle 152. Here, the mask 159 surface and the reticle 152 are placed in an imaging relationship with each other. The position where light from a light source which is defined at a light collecting position placed just after the fly's eye lens 151, is the light re-collection position where the light energy becomes largest. The fifth embodiment is an example of re-imaging optical system which is arranged so that the light re-collecting position is defined out of any lens elements.

As compared with the imaging magnification −1.3× of the re-imaging optical system described with reference to the third embodiment of the present invention, the re-imaging optical system of this embodiment has an imaging magnification of −2.0×. Furthermore, while the third embodiment uses an excimer laser having an emission wavelength of 0.193 μm as a light source, this embodiment uses an excimer laser having an emission wavelength of 0.248 μm as a light source.

FIG. 13 illustrates the relay optical system 154 and the re-imaging optical system of this embodiment. The relay optical system 154 has a similar structure as of the third embodiment, and it comprises a plurality of lens groups. It is an optical system having a function for collecting parallel light incident thereon, adjacent the mask 159 surface. The exit pupil position thereof is placed coincident with the entrance pupil position of the re-imaging optical system which is disposed after the relay optical system.

The re-imaging optical system of this embodiment comprises, in an order from the light entrance side thereof, a cover glass CG151, a first lens group consisting of a concave lens G151 and three convex lenses G152, G153 and G154, a second lens group consisting of a single concave lens G155 only, a third lens group consisting of a single convex lens G156 only, and a fourth lens group consisting of a convex lens G157, a concave lens G158 and a convex lens G159. There is a light path bending portion 154 provided between the third and fourth lens groups, to bend the optical axis 135 at a right angle. Additionally, just before the reticle 152, there is a reticle cover glass CG153 for protection against particles.

Like the third embodiment, the power of the first lens group and the spacing between principal points of the first and second lens groups are determined so that the position 158 of intersection point between the optical axis 155 and the principal ray 157 of abaxial light is defined between the second lens group G155 and the third lens group G156. For, with this arrangement, the light re-collecting position where light from the light source defined at the light collecting position placed just after the fly's eye lens 151 is re-collected and where the light energy density becomes largest can be present in registration with the intersection point position 158 between the optical axis 155 and the principal ray 157 of abaxial light, and it can be present between the concave lens G155 and the convex lens G156. In other words, it is assured that the illumination zone where the energy density becomes largest is prevented from being present inside any lens elements.

Furthermore, in accordance with this embodiment, like the third embodiment, an optical system of triplet type is provided as the fourth lens group. Namely, by disposing convex lens G157, concave lens G158 and convex lens G159 in an order from the light entrance side, distortion aberration as well as parallelism, with respect to the optical axis, of the principal ray of abaxial light toward the reticle 152, that is, the telecentricity, can be maintained at a satisfactory level.

FIG. 14 illustrates transverse aberration in meridional direction and transverse aberration in sagittal direction as well as distortion aberration and exit side telecentricity of the re-imaging optical system of the fifth embodiment, wherein incidence NA is 0.4 and the reticle side largest image height is 57 mm. It is seen from this drawing that transverse aberration is well suppressed within a practically allowable range, while distortion aberration is corrected satisfactorily.

If however the amount of curvature of the exit side telecentricity in this embodiment is exceeded, it becomes difficult to register it with the entrance side telecentricity of the projection optical system for imaging the circuit pattern of the reticle 152 surface upon the wafer. The difficulty of this telecentricity correction is, as described hereinbefore, dependent upon the object-to-image distance T of the re-imaging optical system, from the mask 159 surface to the reticle 159 pattern surface, as well as the entrance pupil distance P that corresponds to the distance from the mask 159 surface to the entrance pupil of the re-imaging optical system. In this embodiment, since T=1320 mm and P=3400 mm, there is a relation P/T=2.576.

Furthermore, in this embodiment, the imaging magnification, that is, the ratio of the extension of the illumination range on the pattern surface of the reticle 152 to the extension of the illumination range on the mask 159 surface, is equal to −2.0×. If the absolute value of this imaging magnification goes beyond 2.5, it may disadvantageously cause an increase in size of the relay optical system 154 or degradation of performance. Hence, the re-imaging optical system should desirably have an imaging magnification having an absolute value $B_M$ which is not greater than 2.5.

Table 5 below shows numerical values of the specification of the re-imaging optical system used in the fifth embodiment.

TABLE 5

$\lambda = 0.248\mu m$, Imaging Magnification = −2.0×
Incidence NA = 0.40, Largest Image Height = 57 mm

| | r | d | n | k |
|---|---|---|---|---|
| Object Plane | ∞ | 25.0 | 1 | |
| 1: | ∞ | 2.0 | 1.50846 | CG151 |
| 2: | ∞ | 47.84 | 1 | |
| 3: | −52.48524 | 9.0 | 1.50846 | G151 |
| 4: | −108.82699 | 18.0 | 1 | |
| 5: | −208.69654 | 44.0 | 1.50846 | G152 |
| 6: | −109.78296 | 4.5 | 1 | |
| *7: | 205.04120 | 67.0 | 1.50846 | G153 |
| 8: | −451.19457 | 15.0 | 1 | |
| 9: | 197.10301 | 60.0 | 1.50846 | G154 |
| 10: | ∞ | 30.13 | 1 | |
| 11: | ∞ | 13.0 | 1.50846 | G155 |
| 12: | 158.46639 | 214.53 | 1 | |
| 13: | 226.23406 | 40.0 | 1.50846 | G156 |
| *14: | −5806.58507 | 155.0 | 1 | |
| 15: | ∞ | 207.0 | 1 | Path Bend Portion |
| 16: | 471.09800 | 48.0 | 1.50846 | G157 |
| 17: | −409.70598 | 21.0 | 1 | |
| 18: | 400.00000 | 12.0 | 1.50846 | G158 |
| 19: | 139.42573 | 49.0 | 1 | |
| 20: | 256.12409 | 30.0 | 1.50846 | G159 |
| 21: | ∞ | 182.0 | 1 | |
| 22: | ∞ | 3.5 | 1.50846 | CG153 |
| 23: | ∞ | 16.15 | 1 | |
| 24: | ∞ | 6.35 | 1.50846 | Reticle |
| Image Plane | ∞ | | | |

(* is aspherical surface)

| Aspherical Coefficient of the 7th Surface | Aspherical Coefficient of the 14th Surface |
|---|---|
| K = −0.621432 | K = −1.50000 |
| A = −4.73916 × $10^{-8}$ | A = +3.01688 × $10^{-8}$ |
| B = +1.32657 × $10^{-12}$ | B = +6.70643 × $10^{-14}$ |
| C = −4.50875 × $10^{-17}$ | C = +7.77355 × $10^{-18}$ |
| D = +6.91309 × $10^{-22}$ | D = −6.28173 × $10^{-23}$ |

Focal Length of Groups

| | |
|---|---|
| f1 = +148.2 mm | Object to Image Distance: T = 1320 mm |
| f2 = −311.7 mm | Entrance Pupil Distance: P = +3400 mm |
| f3 = +429.2 mm | P/T = 2.576 |
| f4 = +514.0 mm | |
| |f2/f3| = 0.726 | |

Position of Intersection Point between Principal Ray of Abaxial Light and Optical Axis (Distance from the 12th Surface)

H = 176.0 mm

In Table 5 above, f1, f2, f3 and f4 are focal lengths of the first, second, third and fourth lens groups, respectively. Also, T and P denotes the object-to-image distance and the entrance pupil distance, respectively, described hereinbefore. Further, H denotes the position 158 of intersection point between the optical axis 155 and the principal ray 157 of abaxial light, and it corresponds to the distance from the twelfth surface which is the light exit side surface of the concave lens G155.

Furthermore, in the lens data table above, r denotes the curvature radius of each surface (unit is mm); d denotes the spacing between adjacent surfaces (unit is mm); n is the refractive index of the medium with respect to the incident light (wavelength is 0.193 µm); and k denotes the lens number of the re-imaging optical system as seen in FIG. 13.

The coefficients regarding the aspherical surface as shown in Table 5 can be expressed by aforementioned equation (1), when the height of an arbitrary point on the aspherical surface with respect to a direction perpendicular to the optical axis is denoted by h, the distance along the optical axis is denoted by x, the curvature radius at the vertex is r, and the curved surface coefficient is denoted by K, and where the aspherical coefficients are denoted by alphabets A to F, respectively, while taking E=F=0 in equation (1).

In accordance with the fifth embodiment of the present invention as described above, the point of intersection between the optical axis and the principal ray of abaxial light is placed between a concave lens and a convex lens, and with this arrangement, a re-imaging optical system can be accomplished which enables: (i) the light re-collecting position can be prevented from being defined inside any optical elements yet an optical system having a small number of lens elements is used; (ii) transverse aberration can be well suppressed within a practically allowable range and, moreover, distortion aberration can be corrected satisfactorily; and (iii) the distortion aberration and the exit side telecentricity can be maintained at a level free of any practical inconveniences.

Like the third embodiment, the re-imaging optical system according to the present embodiment can be incorporated into a projection exposure apparatus such as shown in FIG. 17, for example, to be substituted for a mask imaging optical system that comprises a first light collecting optical system 46, a mirror 47, and a second light collecting optical system 48.

Since the entrance NA of the re-imaging optical system of this embodiment is 0.4 and the imaging magnification is −2.0×, it is possible to use such a projection optical system by which the imaging magnification with respect to the reticle surface vs. wafer substrate surface is made equal to −0.25 and the wafer side imaging numerical aperture NA is made equal to 0.8. The re-imaging optical system of this embodiment is particularly effective where it is used with a projection optical system having an image side numerical aperture NA not less than 0.7.

By using a re-imaging optical system of the structure such as described above as a mask imaging optical system and by incorporating the same into an illumination optical system, an illumination optical system and a projection exposure apparatus that enables further enlargement of NA of the projection optical system while satisfying limitational conditions for structure and for optical materials, can be accomplished by use of a reduced number of lenses and with use of a simplified and compact structure, and without placing the light re-collecting position, where the light energy density becomes largest, inside any optical elements.

The technology having been described above with reference to the first to fifth embodiments can be applied to a σ continuously changing optical system or a mask imaging optical system to be used in an illumination optical system for a projection exposure apparatus. This accomplishes the following two advantageous features at once.

As a first one, the light re-collecting position, that is, the position where the light energy density becomes very large, can be assuredly prevented from being placed inside any optical elements. This is very advantageous because it avoids degradation of internal transmittance of an optical material used as a lens material, or degradation of anti-reflection film applied to the lens surface. As a result, the throughput of the exposure apparatus can be improved, while suppressing deterioration of illuminance of the illumination optical system.

The second advantageous feature is that the first advantageous feature itself can be realized by use of a very simple optical system. This means that, in regard to the σ value of the projection optical system or the numerical aperture NA thereof, a much wide illumination state can be accomplished while keeping the cost and apparatus size as before. Hence, in the semiconductor device manufacturing process, a large variety of circuit patterns can be printed.

It should be noted here that, although the embodiments described above use a fly's eye lens or a rod-like glass as an integrator (plural-light-source forming means), the plural light source forming means usable in the present invention may include a lens array having a plurality of lenses arrayed two-dimensionally (e.g., fly's eye lens or micro-lens array), a glass rod or a hollow rod having mirror surface defined on the inner surface thereof.

Alternatively, as a matter of course, it may include an integrator comprising a pair of cylindrical lens plates (or lenticular lenses) being piled.

[Embodiment 6]

Next, an embodiment of a device manufacturing method which uses an exposure apparatus according to any one of the embodiments described above, will be explained.

Figure 18:
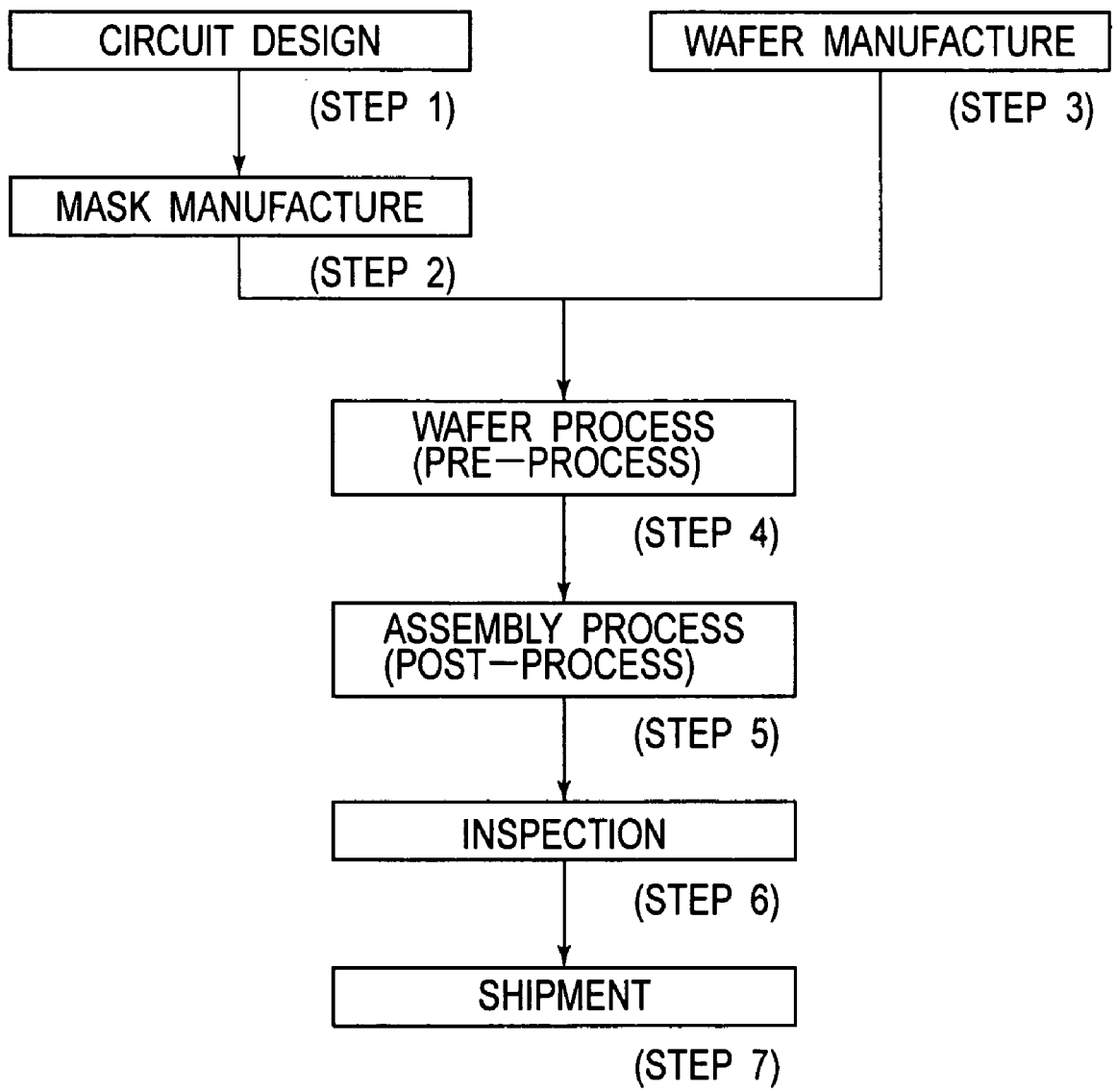
FIG. 18 is a flow chart for explaining microdevice manufacturing processes.

FIG. 18 is a flow chart for explaining the procedure of manufacturing various microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 19:
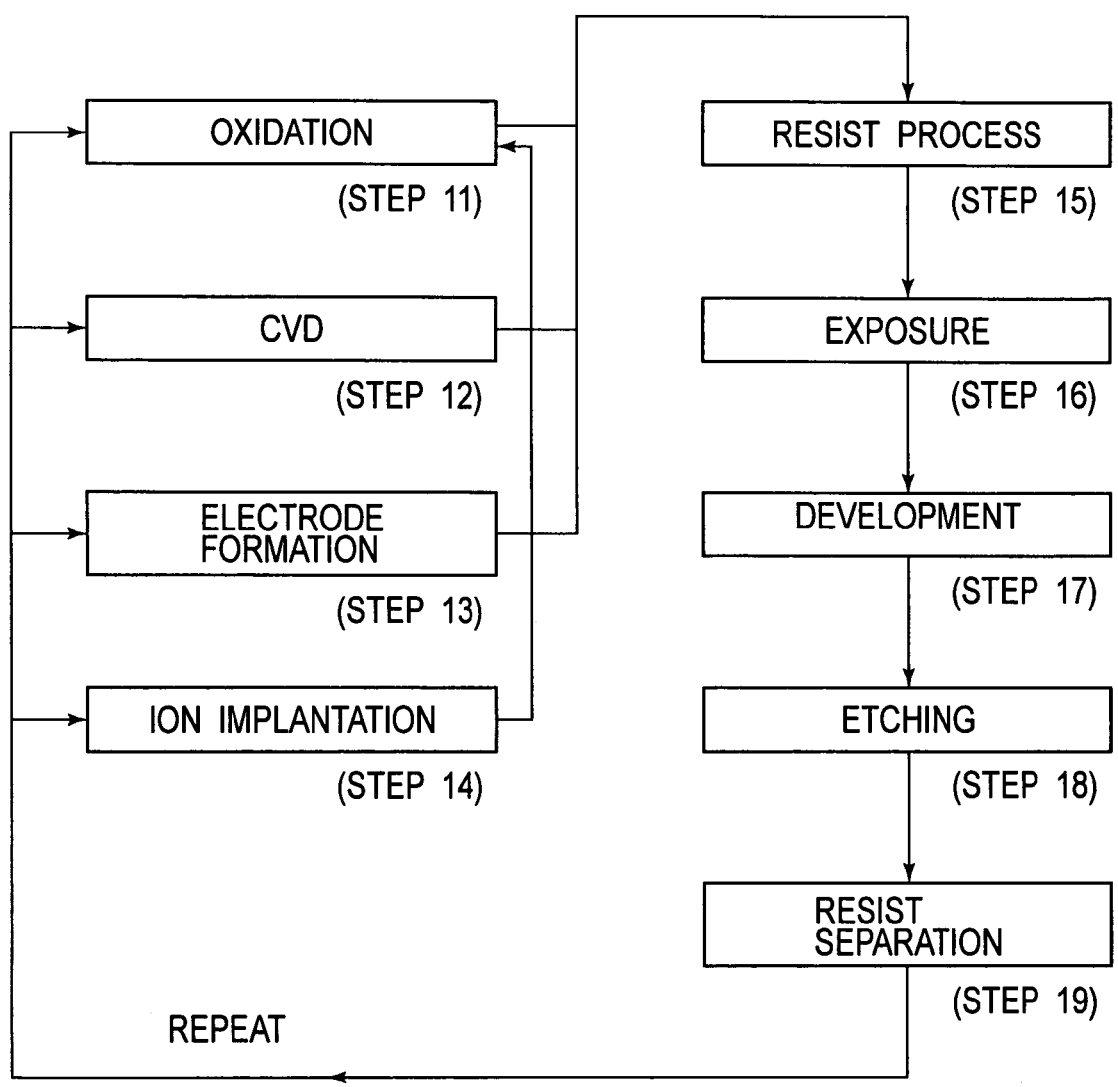
FIG. 19 is a flow chart for explaining details of a wafer process included in the procedure of FIG. 18.

FIG. 19 is a flow chart for explaining details of the wafer process included in the procedure described above. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2004-119249 filed Apr. 14, 2004, for which is hereby incorporated by reference.

What is claimed is:

1. An illumination optical system for illuminating a reticle, said illumination optical system comprising:
    plural-light-source forming means for forming a plurality of light source images by use of light from a light source;
    a relay optical system for directing light from the plurality of light source images to a mask;
    an imaging optical system for imaging the mask upon a surface of the reticle, by use of light from the mask, said imaging optical system including, in an order from a light entrance side thereof, a first lens group having a positive power, a second lens group having a negative power, and a third lens group having a positive power, wherein said second lens group includes a concave lens at a light exit side thereof and wherein said third lens group includes a convex lens at a light entrance side thereof;
    wherein a position of intersection between an optical axis of said imaging optical system and a principal ray of abaxial light is defined between said second lens group and said third lens group.

2. An illumination optical system according to claim 1, wherein said imaging optical system is a telecentric optical system arranged so that a principal ray of abaxial light thereof is made approximately parallel at an image side.

3. An illumination optical system according to claim 1, wherein, when focal lengths of said second and third lens groups are f2 and f3, respectively, a relation $$0.5 \leq |f2/f3| \leq 1.5$$

is satisfied there.

4. An illumination optical system according to claim 1, further comprising a light path bending portion disposed between said third lens group and the reticle, and a fourth lens group having a positive power and being disposed between said light path bending portion and the reticle.

5. An illumination optical system according to claim 1, wherein said second lens group consists of a single concave lens, and wherein said third lens group consists of one or two convex lenses.

6. An illumination optical system according to claim 1, wherein said second and third lens groups are made movable along the optical axis to continuously change the size of an illumination region to be defined upon the reticle surface.

7. An illumination optical system according to claim 6, wherein said first lens group consists of one or two convex lenses.

8. An illumination optical system according to claim 1, wherein, when the distance from the mask to the reticle surface along the optical axis is T, and the distance from the mask to an entrance pupil is P, a relation $$0.15 \leq P/T \leq 2.6$$

is satisfied there.

9. An illumination optical system according to claim 6, wherein said first lens group includes, in an order from a light entrance side thereof, a concave lens and a convex lens or lenses not more than three.

10. An illumination optical system according to claim 6, wherein no lens element is provided between said third lens group and said light path bending portion.

11. An illumination optical system according to claim 8, wherein said fourth lens group includes, in an order from a light entrance side thereof, a convex lens, a concave lens and a convex lens.

12. An illumination optical system according to claim 8, wherein, when an absolute value of imaging magnification of said imaging optical system is $B_M$, a relation $$1.3 \leq B_M \leq 2.5$$

is satisfied there.

13. An exposure apparatus, comprising:
    an illumination optical system as recited in claim 1, for illuminating a reticle; and
    a projection optical system for projecting an image of a pattern of a reticle onto a substrate.

14. An apparatus according to claim 13, wherein a numerical aperture of said projection optical system at the substrate side is $NA_W$, a relation $$0.7 \leq NA_W \leq 0.95$$

is satisfied there.

15. A device manufacturing method, comprising the step of:
    exposing a substrate by use of an exposure apparatus as recited in claim 13; and
    developing the exposed substrate.

* * * * *

UNITED STATES PATENT AND TRADEMARK OFFICE
CERTIFICATE OF CORRECTION

| | |
|---|---|
| PATENT NO. | : 7,170,686 B2 |
| APPLICATION NO. | : 11/105866 |
| DATED | : January 30, 2007 |
| INVENTOR(S) | : Kanjo Orino |

It is certified that error appears in the above-identified patent and that said Letters Patent is hereby corrected as shown below:

Column 24, Line 16, change "claim 6" to --claim 8--; and

Column 24, Line 20, change "claim 6" to --claim 8--.

Signed and Sealed this

Eighteenth Day of March, 2008

JON W. DUDAS
*Director of the United States Patent and Trademark Office*